US012765342B2

(12) United States Patent
Cheng et al.

(10) Patent No.: US 12,765,342 B2
(45) Date of Patent: Oct. 13, 2026

(54) CARBON-BASED LINER TO REDUCE CONTACT RESISTANCE

(71) Applicant: Taiwan Semiconductor Manufacturing Company, Ltd., Hsinchu (TW)

(72) Inventors: Po-Hsien Cheng, Hsinchu (TW); Chi-Ming Yang, Hsinchu (TW); Tze-Liang Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 229 days.

(21) Appl. No.: 17/446,215

(22) Filed: Aug. 27, 2021

(65) Prior Publication Data

US 2022/0352018 A1 Nov. 3, 2022

Related U.S. Application Data

(60) Provisional application No. 63/182,488, filed on Apr. 30, 2021.

(51) Int. Cl.
*H10W 20/00* (2026.01)
*H10W 20/41* (2026.01)
(Continued)

(52) U.S. Cl.
CPC ....... *H10W 20/035* (2026.01); *H10W 20/034* (2026.01); *H10W 20/038* (2026.01);
(Continued)

(58) Field of Classification Search
CPC ... H01L 21/768–76898; H01L 23/522–53295; H10W 20/035;
(Continued)

(56) References Cited

U.S. PATENT DOCUMENTS

2002/0042202 A1* 4/2002 Fujimoto .......... H01L 21/76897 438/700
2002/0056879 A1* 5/2002 Wieczorek ........ H01L 21/76816 257/368
(Continued)

OTHER PUBLICATIONS

Definition of "interface" from TheFreeDictionary.com at https://www.thefreedictionary.com/interface. (Year: 2016).*

*Primary Examiner* — Erik Kielin
(74) *Attorney, Agent, or Firm* — Harrity & Harrity, LLP

(57) ABSTRACT

A layer of carbon (e.g., graphite or graphene) at a metal interface (e.g., between an MEOL interconnect and a gate contact or a source or drain region contact, between an MEOL contact plug and a BEOL metallization layer, and/or between BEOL conductive structures) is used to reduce contact resistance at the metal interface, which increases electrical performance of an electronic device. Additionally, in some implementations, the layer of carbon may help prevent heat transfer from a second metal to a first metal when the second metal is deposited over the first metal. This results in more symmetric deposition of the second metal, which reduces surface roughness and contact resistance at the metal interface. As an alternative, in some implementations, the layer of carbon is etched before deposition of the second metal in order to reduce contact resistance at the metal interface.

20 Claims, 33 Drawing Sheets

(51) Int. Cl.
*H10W 20/42* (2026.01)
*H10W 20/44* (2026.01)

(52) U.S. Cl.
CPC ..... *H10W 20/425* (2026.01); *H10W 20/4403* (2026.01); *H10W 20/077* (2026.01); *H10W 20/42* (2026.01)

(58) Field of Classification Search
CPC ............. H10W 20/034; H10W 20/038; H10W 20/425; H10W 20/4403; H10W 20/077; H10W 20/42; H10W 20/037; H10W 20/033; H10W 20/032; H10W 20/069
See application file for complete search history.

(56) References Cited

U.S. PATENT DOCUMENTS

2002/0076921 A1 6/2002 Fukada et al.
2004/0084777 A1* 5/2004 Yamanoue .............. H01L 24/05 257/E21.244
2005/0176253 A1* 8/2005 Shigeta ................. B24B 37/044 438/692
2007/0018331 A1* 1/2007 Chen ..................... H01L 23/585 257/762
2011/0248404 A1* 10/2011 Chiu ................... H01L 21/6835 257/773
2014/0235049 A1* 8/2014 Yang ..................... H01L 23/528 438/610
2014/0284802 A1* 9/2014 Sakata .............. H01L 23/53257 257/750
2014/0367857 A1* 12/2014 Yang ................. H01L 21/76849 438/653
2016/0172239 A1* 6/2016 Padhi .................. H01L 21/0228 438/786
2017/0236781 A1* 8/2017 Briggs .............. H01L 21/76867 257/751
2019/0148153 A1* 5/2019 Cheng ............... H01L 21/28568 257/751
2021/0035902 A1 2/2021 Kang et al.
2021/0057335 A1* 2/2021 Yang ................... H01L 23/5226
2022/0068633 A1* 3/2022 Shin .................. H01L 21/02299
2022/0068704 A1 3/2022 Shin et al.
2023/0245924 A1* 8/2023 Narkeviciute .... H01L 23/53276 257/760

* cited by examiner

CARBON-BASED LINER TO REDUCE CONTACT RESISTANCE

CROSS-REFERENCE TO RELATED APPLICATION

This Patent Application claims priority to U.S. Provisional Patent Application No. 63/182,488, filed on Apr. 30, 2021, and entitled "GRAPHENE OR GRAPHITE LINER TO REDUCE CONTACT RESISTANCE." The disclosure of the prior Application is considered part of and is incorporated by reference into this Patent Application.

BACKGROUND

Some electronic devices, such as a processor, a memory device, or another type of electronic device, include a middle end of line (MEOL) region that electrically connects transistors in a front end of line (FEOL) region to a back end of line (BEOL) region. The MEOL region may include a dielectric layer and contact plugs (also referred to as contact vias) formed in the dielectric layer. The contact plugs may electrically connect to source/drain regions and metal gates of the FEOL region. A contact plug may include one or more metals, such as tungsten, cobalt, ruthenium, or copper.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
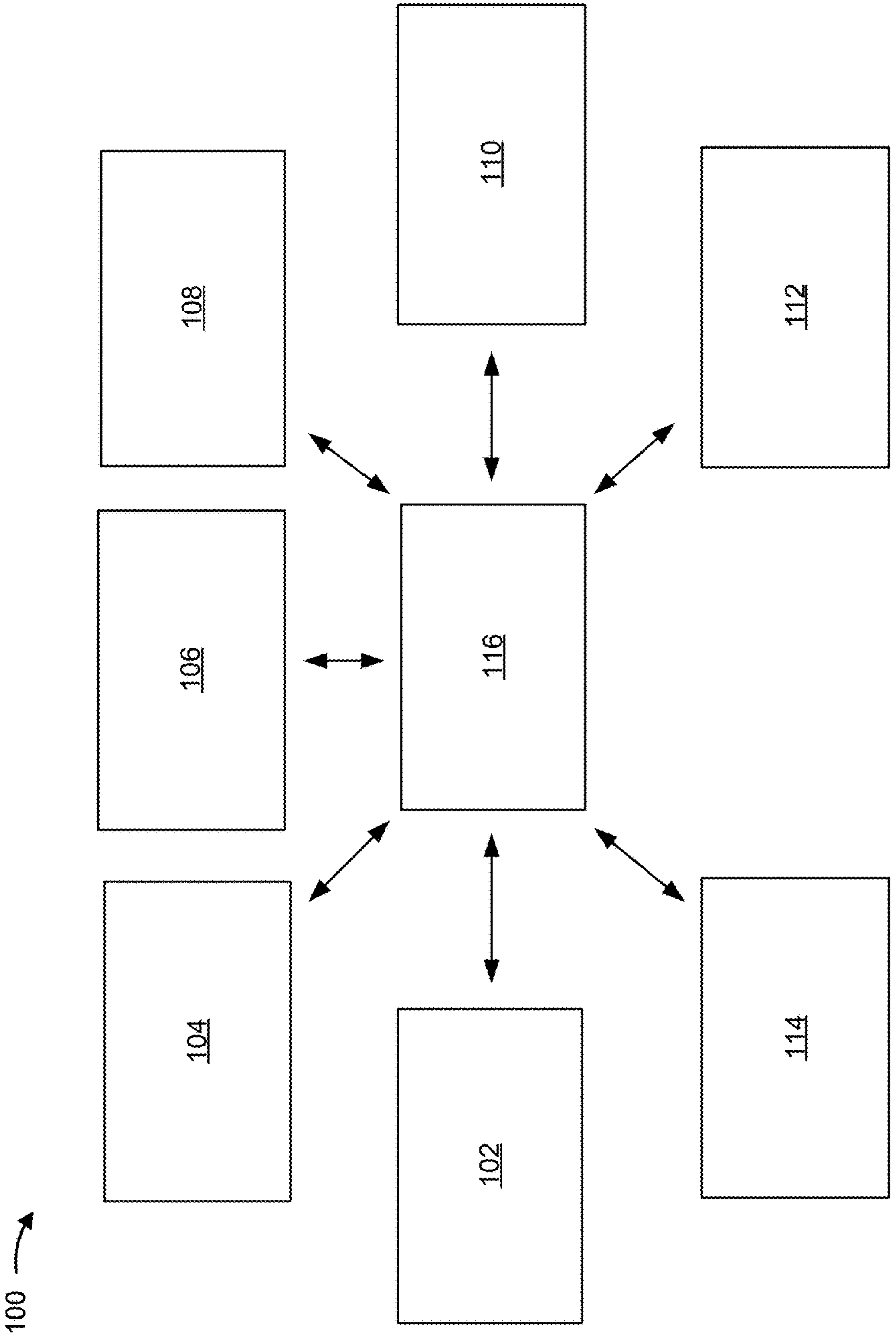
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, an MEOL region may electrically connect semiconductor structures in an FEOL region of an electronic device to a BEOL region of the electronic device. An MEOL region may include a dielectric layer and contact plugs (also referred to as contact vias) formed in the dielectric layer. The contact plugs may electrically connect to source or drain regions and metal gates of the FEOL region. Accordingly, a contact plug may include a metal (e.g., copper (Cu), cobalt (Co), ruthenium (Ru), or another metal) such that the contact plug connects to a source or a drain contact (or to a gate contact) at a metal interface. The BEOL region may electrically connect the contact plugs of the MEOL region to interconnects or other conductive structures (such as metallization layers, also referred to as wires, or vias). The metallization layers (e.g., copper, cobalt, ruthenium, or another metal) may contact each other (or the contact plugs) at metal interfaces.

Copper is often used for BEOL metallization layers and vias (or for MEOL contact plugs) due to low contact resistance and sheet resistance relative to other conductive materials, such as aluminum (Al). Lower resistivity provides lower resistance/capacitance (RC) time constants and faster propagation of signals across an electronic device. However, copper also has a high diffusion (or electromigration) rate, which can cause copper ions to diffuse into surrounding dielectric material. This diffusion causes an increase in resistivity for BEOL metallization layers and vias (or for MEOL contact plugs), which can decrease electrical performance of an electronic device. Moreover, diffusion may result in copper ions migrating into other MEOL layers and/or FEOL layers, which can cause semiconductor device failures and reduced manufacturing yield.

When metal interfaces are formed using different metals (e.g., a first metal such as copper for one region and a second metal such as cobalt for another region), heat transfer from the second metal to the first metal when the second metal is deposited over the first metal can cause asymmetric deposition of the second metal. This asymmetry results in air pockets or other irregularities at the metal interface that increase contact resistance at the metal interface. The increased contact resistance can decrease electrical performance of the electronic device.

Accordingly, barrier layers (such as titanium nitride (TiN), tantalum nitride (TaN), and/or another type of barrier layer) may be deposited to prevent diffusion. These barrier layers can also help prevent heat transfer from a second metal to a first metal when the second metal is deposited over the first metal. However, the barrier layers increase contact resistance when deposited at the metal interface, which again decreases electrical performance of the electronic device.

Some implementations described herein provide a layer of graphite or graphene at a metal interface (e.g., between an MEOL interconnect and a gate contact or a source or drain region contact, between an MEOL contact plug and a BEOL metallization layer, and/or between BEOL conductive structures) in lieu of a barrier layer. Because graphite and graphene have significantly lower resistance than the barrier layer, the contact resistance is reduced, which increases electrical performance of the electronic device.

Additionally, in some implementations, the graphite or graphene may help prevent heat transfer from a second metal to a first metal when the second metal is deposited over the first metal. This results in more symmetric deposition of the second metal, which further reduces contact resistance at the metal interface. As an alternative, in some implementations, the layer of graphite or graphene is etched before deposition of the second metal in order to further reduce contact resistance at the metal interface.

FIG. 1 is a diagram of an example environment 100 in which systems and/or methods described herein may be implemented. The example environment 100 includes semiconductor processing tools that can be used to form semiconductor structures and devices, such as semiconductor structure or device that includes a graphene or a graphite liner as described herein.

As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, a photoresist removal tool 114, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool, such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or another type of exposure tool. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or another type of etch tool. In some implementations, the etch tool 108 includes a chamber that is filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The photoresist removal tool 114 is a semiconductor processing tool that is capable of removing a photoresist from a semiconductor structure. The photoresist removal tool 114 may generate a plasma that is directed toward the substrate such that the plasma binds with the photoresist or otherwise causes the photoresist to become gaseous rather than being bound to the semiconductor structure. Additionally, or alternatively, the photoresist removal tool 114 may provide a chemical stripping agent to the substrate such that the agent binds with the photoresist rather than being bound to the semiconductor structure.

The wafer/die transport tool 116 includes a mobile robot, a robot arm, a tram or rail car, an overhead hoist transfer (OHT) vehicle, an automated material handling system (AMHS), and/or another type of tool that is used to transport wafers and/or dies between semiconductor processing tools 102-114 and/or to and from other locations such as a wafer rack, a storage room, or another location. In some implementations, the wafer/die transport tool 116 is a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
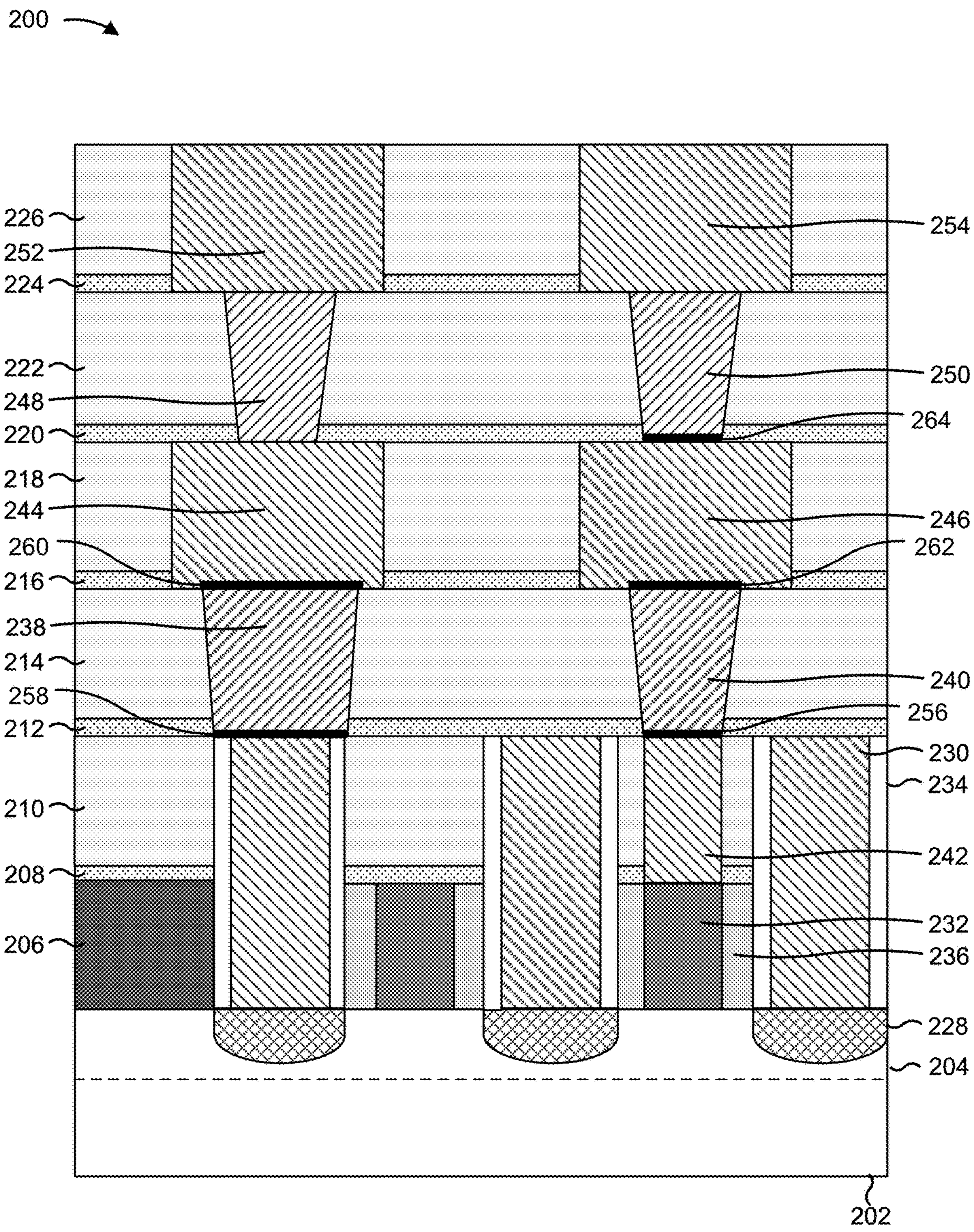
FIG. 2 is a diagram of an example semiconductor structure described herein.

FIG. 2 is a diagram of a portion of an example device 200 described herein. Device 200 includes an example of a memory device (e.g., a static random access memory (SRAM), a dynamic random access memory (DRAM)), a logic device, a processor, an input/output device, or another type of semiconductor device that includes one or more transistors.

The device 200 includes a fin structure 204 patterned on a substrate 202. The device 200 further includes one or more stacked layers, including a dielectric layer 206, an etch stop layer (ESL) 208, a dielectric layer 210, an ESL 212, a dielectric layer 214, an ESL 216, a dielectric layer 218, an ESL 220, a dielectric layer 222, an ESL 224, and a dielectric layer 226, among other examples. The dielectric layers 206, 210, 214, 218, 222, and 226 are included to electrically isolate various structures of the device 200. The dielectric layers 206, 210, 214, 218, 222, and 226 include a silicon nitride (SiNx), an oxide (e.g., a silicon oxide (SiOx) and/or another oxide material), and/or another type of dielectric material. Accordingly, the dielectric layers 206, 210, 214, 218, 222, and 226 may also be referred to as oxide layers. The ESLs 208, 212, 216, 220, and 224 include a layer of material that is configured to permit various portions of the device 200 (or the layers included therein) to be selectively etched or protected from etching to form one or more of the structures included in the device 200.

As further shown in FIG. 2, the device 200 includes a plurality of epitaxial (epi) regions 228 that are grown and/or otherwise formed on and/or around portions of the fin structure 204. The epitaxial regions 228 are formed by epitaxial growth. In some implementations, the epitaxial regions 228 are formed in recessed portions in the fin structure 204. The recessed portions may be formed by strained source drain (SSD) etching of the fin structure 204 and/or another type etching operation. The epitaxial regions 228 function as source/drain regions of the transistors included in the device 200.

The epitaxial regions 228 are electrically connected to metal source or drain contacts 230 of the transistors included in the device 200. The metal source or drain contacts (MDs or CAs) 230 include cobalt (Co), ruthenium (Ru), and/or another conductive or metal material. The transistors further include gates 232 (MGs), which are formed of a polysilicon material, a metal (e.g., tungsten (W) or another metal), and/or another type of conductive material. The metal source or drain contacts 230 and the gates 232 are electrically isolated by one or more sidewall spacers, including spacers 234 in each side of the metal source or drain contacts 230 and spacers 236 on each side of the gate 232. The spacers 234 and 236 may include a silicon oxide (SiOx), a silicon nitride (SiXNy), a silicon oxy carbide (SiOC), a silicon oxycarbonitride (SiOCN), and/or another suitable material. In some implementations, the spacers 234 are omitted from the sidewalls of the source or drain contacts 230.

As further shown in FIG. 2, the metal source or drain contacts 230 and the gates 232 are electrically connected to one or more types of interconnects. The interconnects electrically connect the transistors of the device 200 and/or electrically connect the transistors to other areas and/or components of the device 200. In some implementations, the interconnects electrically connect the transistors to a back end of line (BEOL) region of the device 200.

One or more of the metal source or drain contacts 230 are electrically connected to source/drain interconnects 238 (e.g., source/drain vias or VDs). One or more of the gates 232 are electrically connected to gate interconnects 240 (e.g., gate vias or VGs). The interconnects 238 and 240 include a conductive material such as tungsten, cobalt, ruthenium, copper, and/or another type of conductive material. In some implementations, the gates 232 are electrically connected to the gate interconnects 240 by gate contacts 242 (CB or MP) to reduce contact resistance between the gates 232 and the gate interconnects 240. The gate contacts 242 include tungsten (W), cobalt (Co), ruthenium (Ru), titanium (Ti), aluminum (Al), copper (Cu) or gold (Au), among other examples of conductive materials.

As further shown in FIG. 2, the interconnects 238 and 240 are electrically connected to a plurality of BEOL layers, each including one or more metallization layers and/or vias. As an example, the interconnects 238 and 240 may be electrically connected to an M0 metallization layer that includes conductive structures 244 and 246. The M0 metallization layer is electrically connected to a V0 via layer that includes vias 248 and 250. The V0 via layer is electrically connected to an M1 metallization layer that includes conductive structures 252 and 254. In some implementations, the BEOL layers of the device 200 may include additional metallization layers and/or vias that connect the device 200 to a package.

As further shown in FIG. 2, the device 200 includes one or more carbon-based layers to reduce contact resistance at metal interfaces of the device 200. In some implementations, the carbon-based layers are graphene (e.g., two-dimensional carbon structures) or graphite (e.g., three-dimensional carbon structures). The carbon-based layers may have a depth included in a range from approximately 1 nanometer (nm) to approximately 5 nm. By selecting a depth of at least 1 nm, the carbon-based layer is protected from overgrowth by a corresponding ESL (e.g., ESL 212, ESL 216, ESL 220, or another ESL) during epitaxial growth of the corresponding ESL. Preventing epitaxial overgrowth of the corresponding ESL reduces contact resistance at the carbon-based layer. Selecting a depth of at least 1 nm also prevents heat transfer, which results in more symmetric deposition of the metal above the carbon-based layer, which further reduces contact resistance. By selecting a depth of no more than 5 nm, the carbon-based layer does not significantly increase contact resistance. Selecting a depth of no more than 5 nm also shortens an amount of time, power, and chemicals consumed if the carbon-based layer is etched (e.g., as described in greater detail with respect to FIG. 5G and FIG. 7F).

The device 200 may include a carbon-based layer 256 at a metal interface between the gate contact 242 and the interconnect 240 (also referred to as contact plug 240). In some implementations, the carbon-based layer 256 may be deposited as described with respect to FIGS. 4A-4G. The implementations described with respect to FIGS. 4A-4G reduce surface roughness at the metal interface by using the carbon-based layer 256 to prevent heat transfer during deposition of the interconnect 240. As an alternative, the carbon-based layer 256 may be deposited as described with respect to FIGS. 5A-5H. The implementations described with respect to FIGS. 5A-5H further reduce contact resistance at the metal interface by etching the carbon-based layer 256 before deposition of the interconnect 240.

Additionally, or alternatively, the device 200 may include a carbon-based layer 258 at a metal interface between the metal source or drain contact 230 and the interconnect 238 (also referred to as contact plug 238). In some implementations, the carbon-based layer 258 may be deposited similarly as is described with respect to FIGS. 4A-4G. The implementations described with respect to FIGS. 4A-4G reduce surface roughness at the metal interface by using the carbon-based layer 258 to prevent heat transfer during deposition of the interconnect. As an alternative, the carbon-based layer 258 may be deposited similarly as is described with respect to FIGS. 5A-5H. The implementations described with respect to FIGS. 5A-5H further reduce contact resistance at the metal interface by etching the carbon-based layer before deposition of the interconnect 238.

Additionally, or alternatively, the device 200 may include a carbon-based layer 260 at a metal interface between the interconnect 238 (associated with the metal source or drain contact 230) and the conductive structure 244 (also referred to as metallization layer 244). In some implementations, the carbon-based layer 260 may be deposited similarly as is described with respect to FIGS. 6A-6F. The implementations described with respect to FIGS. 6A-6F reduce surface roughness at the metal interface by using the carbon-based layer 260 to prevent heat transfer during deposition of the conductive structure 244. As an alternative, the carbon-based layer 260 may be deposited similarly as is described with respect to FIGS. 7A-7G. The implementations described with respect to FIGS. 7A-7G further reduce contact resistance at the metal interface by etching the carbon-based layer 260 before deposition of the conductive structure 244.

Additionally, or alternatively, the device 200 may include a carbon-based layer 262 at a metal interface between the interconnect 240 (associated with the gate contact 242) and the conductive structure 246 (also referred to as metallization layer 246). In some implementations, the carbon-based layer 262 may be deposited as described with respect to FIGS. 6A-6F. The implementations described with respect to FIGS. 6A-6F reduce surface roughness at the metal interface by using the carbon-based layer 262 to prevent heat transfer during deposition of the conductive structure 246. As an alternative, the carbon-based layer 262 may be deposited as described with respect to FIGS. 7A-7G. The implementations described with respect to FIGS. 7A-7G further reduce contact resistance at the metal interface by etching the carbon-based layer 262 before deposition of the conductive structure 246.

Additionally, or alternatively, the device 200 may include a carbon-based layer 264 at a metal interface between the conductive structure 246 and the via 250. In some implementations, the carbon-based layer 264 may be deposited similarly as is described with respect to FIGS. 6A-6F. The implementations described with respect to FIGS. 6A-6F reduce surface roughness at the metal interface by using the carbon-based layer 264 to prevent heat transfer during deposition of the via 250. As an alternative, the carbon-based layer 264 may be deposited similarly as is described with respect to FIGS. 7A-7G. The implementations described with respect to FIGS. 7A-7G further reduce contact resistance at the metal interface by etching the carbon-based layer 264 before deposition of the via 250.

Additionally, or alternatively, the device 200 may include a carbon-based layer at a metal interface between the conductive structure 244 and the via 248, between the via 248 and the conductive structure 252 (also referred to as metallization layer 252), and/or between the via 250 and the conductive structure 254 (also referred to as metallization layer 254).

As indicated above, FIG. 2 is provided as an example. Other examples may differ from what is described with regard to FIG. 2.

Figure 3:
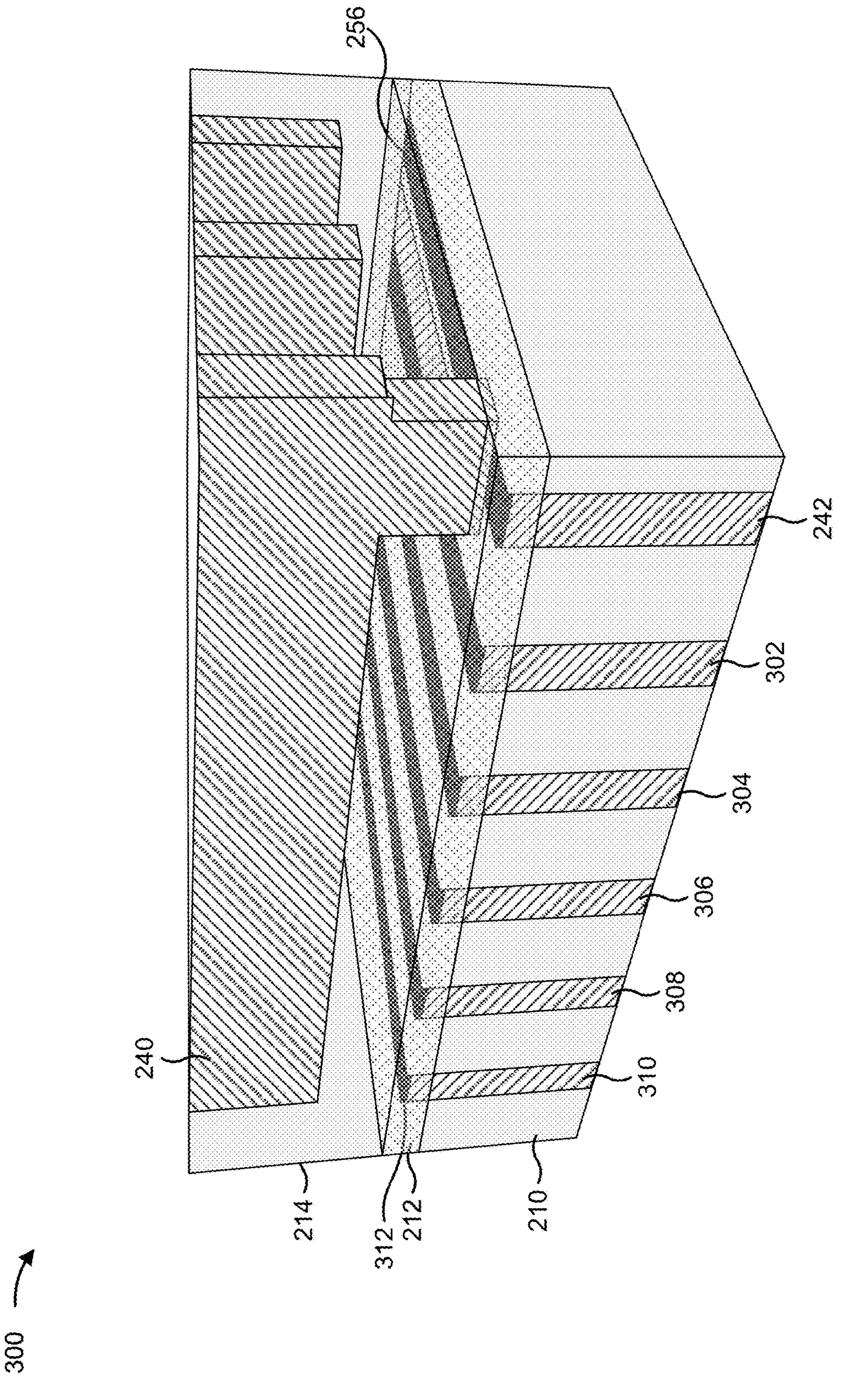
FIG. 3 is a three-dimensional diagram of an example semiconductor structure described herein.

FIG. 3 is a three-dimensional diagram of a portion of an example device 300 described herein. For example, the device 300 may include at least a portion of device 200 of FIG. 2.

As shown in FIG. 3, a gate contact 242 may include a carbon-based layer 256 between at a metal interface between a top surface of the gate contact 242 and a bottom surface of a contact plug 240. Similar to FIG. 2, the gate contact 242 is formed in an oxide layer 210, and the contact plug 240 is formed in an oxide layer 214. Between the oxide layers 210 and 214 is one or more ESLs, such as ELS 212.

As further shown in FIG. 3, the device 300 includes a plurality of dummy gate contacts 302, 304, 306, 308, and 310. As shown in FIG. 3, the dummy gate contacts 302, 304, 306, 308, and 310 are not electrically connected to the contact plug 240. Accordingly, portions of the contact plug 240 above the dummy gate contacts 302, 304, 306, 308, and 310 may function as dummy contact plugs. Nevertheless, the dummy gate contacts 302, 304, 306, 308, and 310 may include corresponding carbon-based layers, such as carbon-based layer 312, on top surfaces of the dummy gate contacts 302, 304, 306, 308, and 310. For example, the carbon-based layers may be deposited as described with respect to FIGS. 6A-6F or with respect to FIGS. 7A-7G.

Although described with respect to gate contact 242 and contact plug 240, the description similarly applies to other metal interfaces. For example, device 300 may include an interface between a metal source or drain contact 230 and a contact plug 238 and include a plurality of dummy metal source or drain contacts with carbon-based layers on top surfaces thereof. Additionally, or alternatively, device 300 may include an interface between the contact plug 240 (or the contact plug 238) and a metallization layer 246 (or a metallization layer 244, respectively) and include a plurality of dummy contact plugs with carbon-based layers on top surfaces thereof. Additionally, or alternatively, device 300 may include an interface between the metallization layer 246 (or the metallization layer 244) and a via 250 (or a via 248, respectively) and include a plurality of dummy metallization layers with carbon-based layers on top surfaces thereof. Additionally, or alternatively, device 300 may include an interface between the via 250 (or the via 248) and a metallization layer 254 (or a metallization layer 252, respectively) and include a plurality of dummy vias with carbon-based layers on top surfaces thereof.

Although described with respect to a single contact plug 240 that includes portions functioning as dummy contact plugs, the description similarly applies to a plurality of dummy contact plugs above the dummy gate contacts. For example, the plurality of dummy contact plugs may include a dummy contact plug 246*b* deposited as described with respect to FIGS. 6A-6F or with respect to FIGS. 7A-7G.

As indicated above, FIG. 3 is provided as an example. Other examples may differ from what is described with regard to FIG. 3.

FIGS. 4A-4G are diagrams of an example implementation 400 described herein. Example implementation 400 may be an example process for forming a carbon-based layer 256. The carbon-based layer 256 reduces contact resistance, which increases electrical performance of the electronic device. Additionally, the carbon-based layer 256 helps prevent heat transfer during deposition of an interconnect 240 over a gate contact 242. This results in more symmetric deposition of the interconnect 240, which further reduces contact resistance. Example implementation 400 may be similarly used to form a carbon-based layer 258 between a metal source or drain contact 230 and an interconnect 238.

Figure 4A:
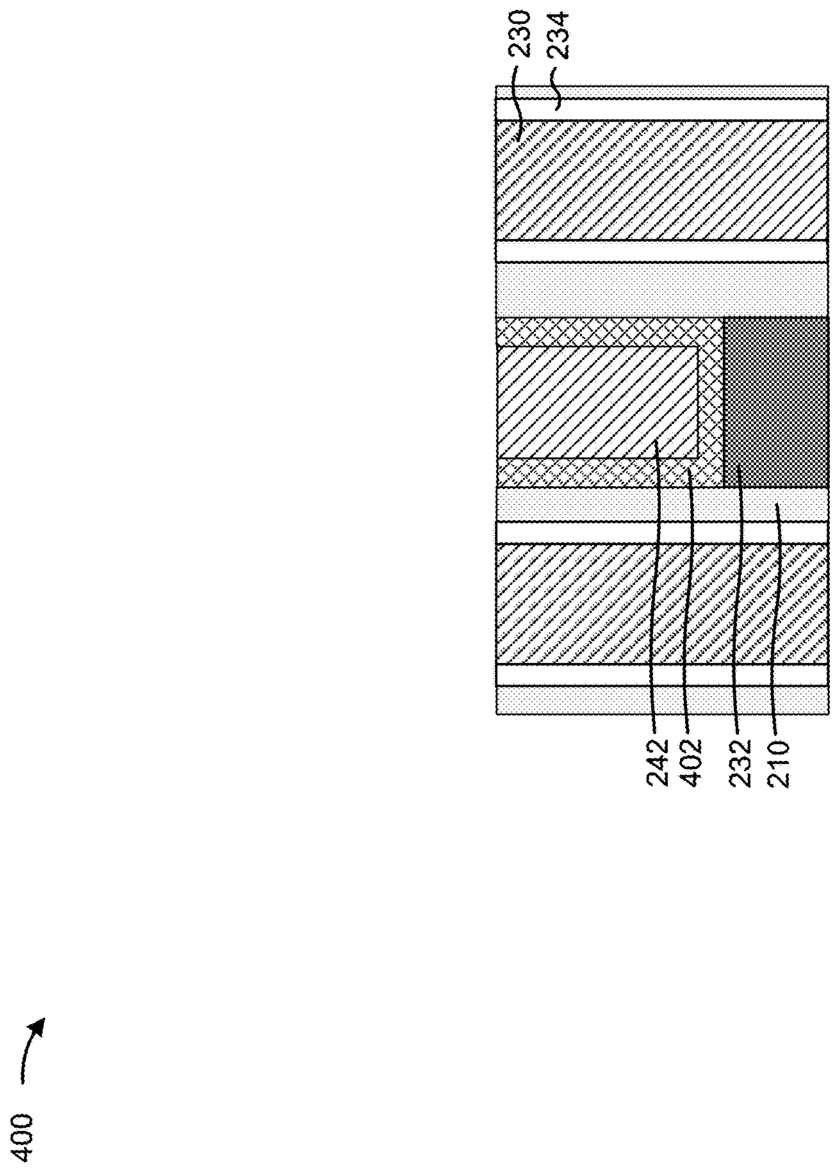
FIGS. 4A-4G are diagrams of an example implementation described herein.

As shown in FIG. 4A, the example process for forming the interconnect 240 may be performed in connection with an FEOL. In some implementations, the FEOL includes a gate contact 242 formed over a gate 232 within an oxide layer 210. Additionally, the FEOL may include one or more metal source or drain contacts 230 formed in the oxide layer 210. As shown in FIG. 4A, the metal source or drain contacts 230 may include spacers 234. In some implementations, the gate 232 may additionally include spacers 236.

In some implementations, the gate contact 242 may be surrounded (e.g., on sidewalls and/or a bottom surface) by a barrier layer 402. For example, the barrier layer 402 may include a nitride, such as titanium nitride (TiN) or tantalum nitride (TaN). In some implementations, the barrier layer 402 may have a thickness in a range from approximately 1 nm to approximately 3 nm. By selecting a thickness of at least 1 nm, diffusion of metal (e.g., copper) from the gate contact 242 can be prevented, which reduces resistivity of the gate contact 242 and prevents failure of an electrical device including the gate contact 242. Selecting a thickness of no more than 3 nm reduces contact resistance caused by the barrier layer 402.

Figure 4B:
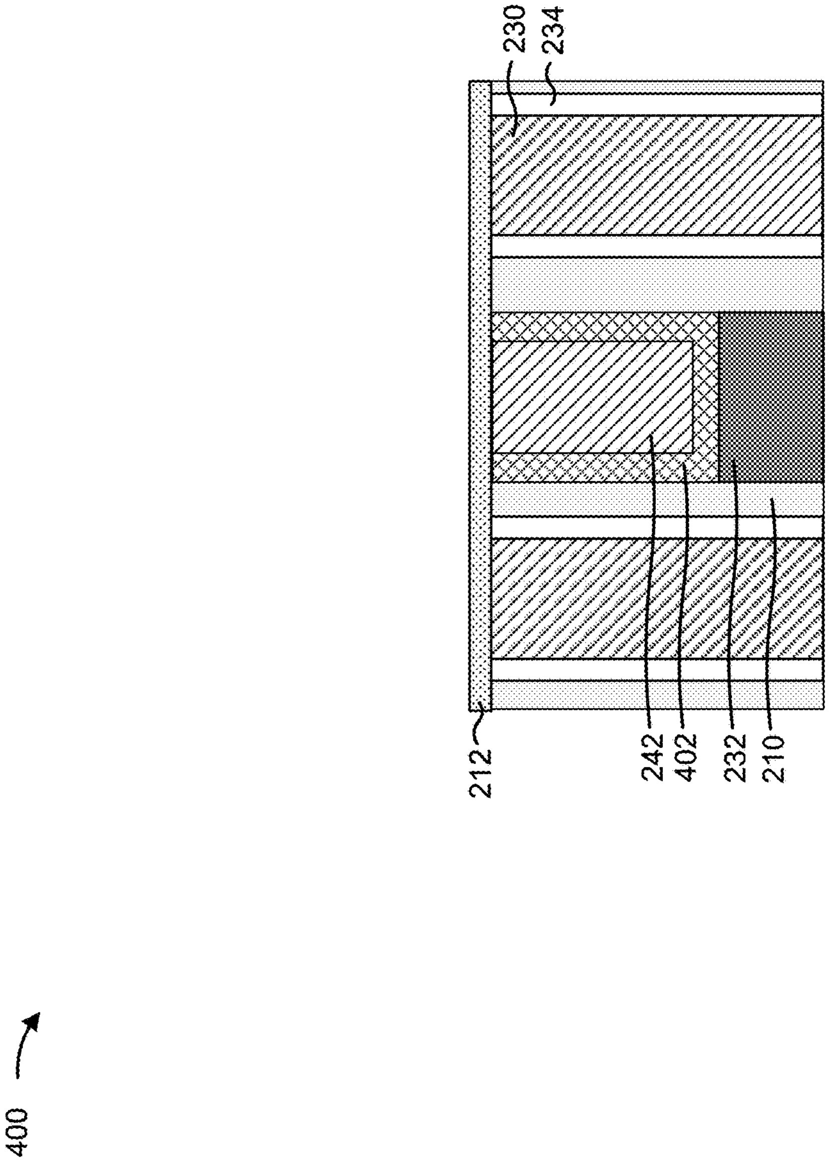

As shown in FIG. 4B, ESL 212 may be formed over the gate contact 242 and the metal source or drain contacts 230. The deposition tool 102 may deposit the ESL 212 by a CVD technique, a PVD technique, an ALD technique, or another type of deposition technique. The planarization tool 110 may planarize the ESL 212 after the ESL 212 is deposited.

In some implementations, the ESL 212 may have a thickness in a range from approximately 1 nm to approximately 3 nm. By selecting a thickness of at least 1 nm, the ESL 212 can function to prevent over-etching of layers above the ESL 212. Selecting a thickness of no more than 3 nm can prevent the ESL 212 from impeding patterning of layers above the ESL 212 (e.g., as described with respect to FIG. 4D).

Figure 4C:
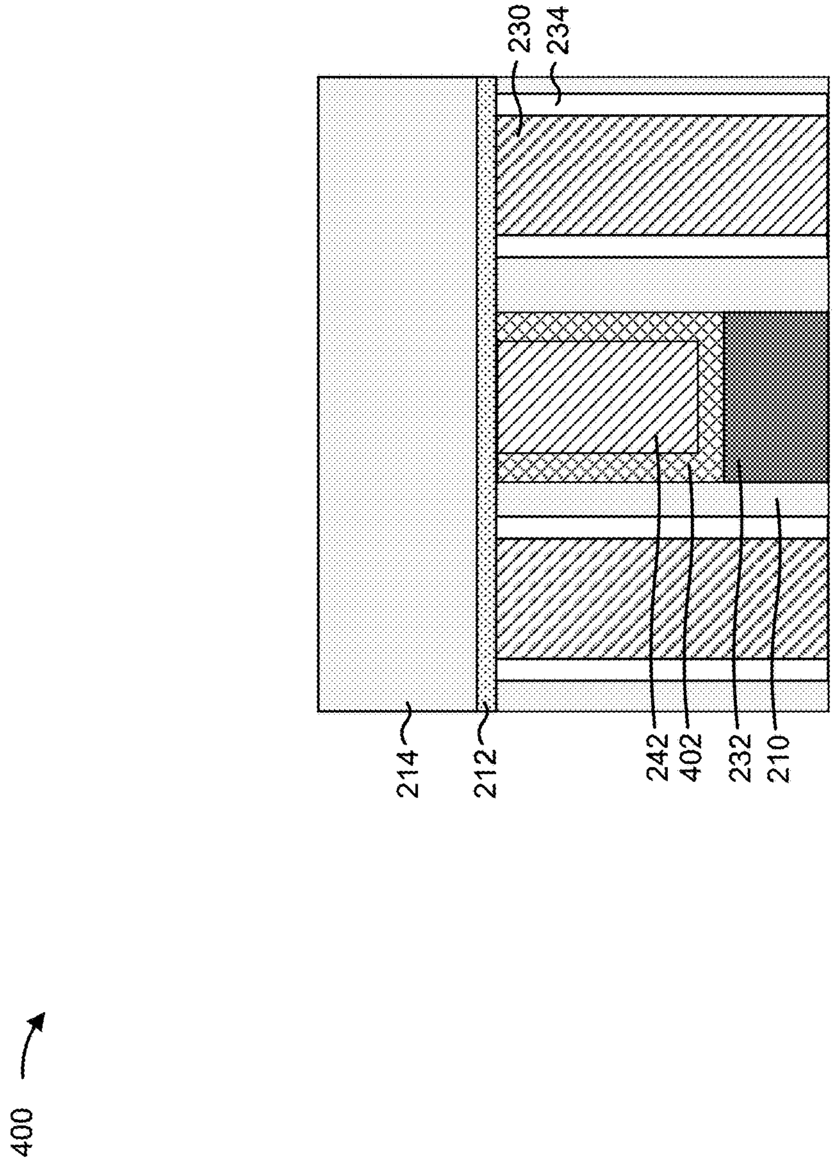

As shown in FIG. 4C, oxide layer 214 (also referred to as dielectric layer 214) may be formed over the metal source/drain 230. The deposition tool 102 may deposit the oxide layer 214 by a CVD technique, a PVD technique, an ALD technique, or another type of deposition technique. The planarization tool 110 may planarize the oxide layer 214 after the oxide layer 214 is deposited.

Figure 4D:
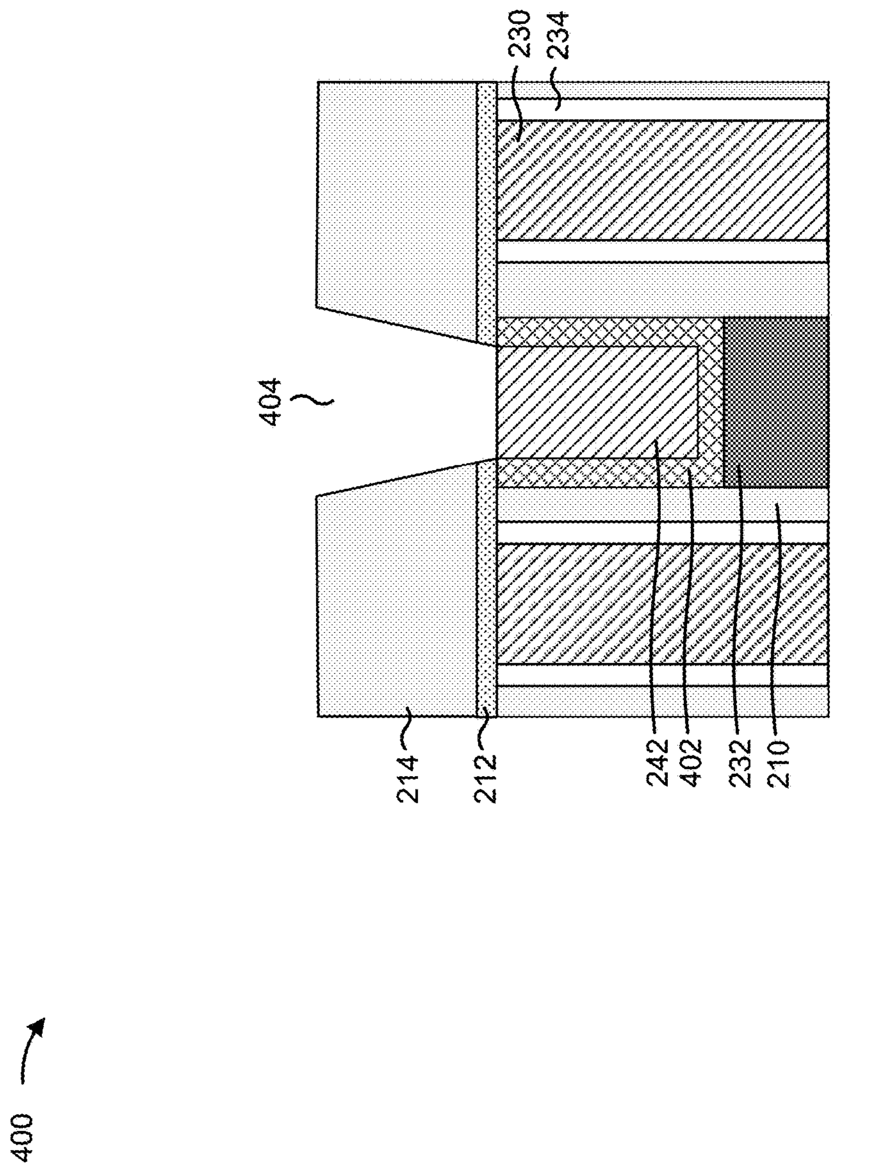

As shown in FIG. 4D, the oxide layer 214 may be etched to form an opening (resulting in recess 404) such that the gate contact 242 is at least partially exposed. For example, the deposition tool 102 may form a photoresist layer on the oxide layer 214 (or on an ESL formed on the oxide layer 214, such as ESL 216), the exposure tool 104 may expose the photoresist layer to a radiation source to pattern the photoresist layer, the developer tool 106 may develop and remove portions of the photoresist layer to expose the pattern, and the etch tool 108 may etch portions of the oxide layer 214 to form the recess 404. In some implementations, the photoresist removal tool 114 removes the remaining portions of the photoresist layer (e.g., using a chemical stripper, a plasma asher, and/or another technique) after the etch tool 108 etches the recess 404.

Although described herein with respect to forming the recess 404 in the oxide layer 214 above the gate contact 242, the description similarly applies to forming the recess 404 in the oxide layer 214 above one or more of the metal source or drain contacts 230.

Figure 4E:
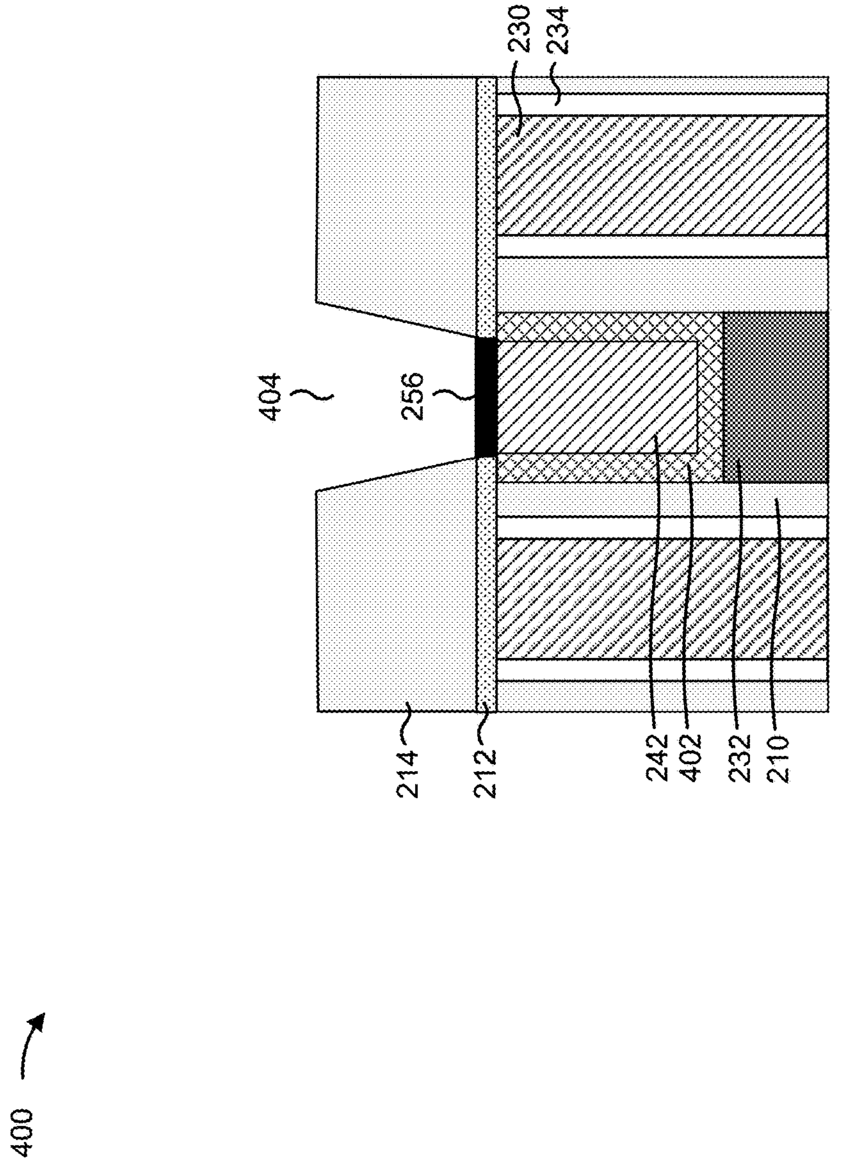

As shown in FIG. 4E, carbon-based layer 256 may be formed over the gate contact 242. The deposition tool 102 may deposit the carbon-based layer 256 by a CVD technique, a PVD technique, an ALD technique, or another type of deposition technique. In some implementations, the carbon-based layer 256 is selectively deposited on the gate contact 242, but not on the sidewalls of recess 404. For example, the carbon-based layer 256 may be deposited using organic precursor materials that react with metals (and thus the gate contact 242) but not with dielectric materials (and thus the oxide layer 214).

In some implementations, the carbon-based layer 256 may have a thickness in a range from approximately 1 nm to approximately 5 nm. By selecting a thickness of at least 1 nm, the carbon-based layer 256 prevents barrier layer 406 (as described with respect to FIG. 4F) from forming on the gate contact 242. Preventing the barrier layer 406 from depositing on the gate contact 242 reduces contact resistance at the gate contact 242. Selecting a depth of at least 1 nm also prevents heat transfer during deposition of interconnect 240 (as described with respect to FIG. 4G), resulting in more symmetric deposition of the interconnect 240, which further reduces contact resistance. By selecting a depth of no more than 5 nm, the carbon-based layer 256 does not significantly increase contact resistance at the gate contact 242.

Although described herein with respect to forming the carbon-based layer 256 on the gate contact 242, the description similarly applies to forming a carbon-based layer 258 on one or more of the metal source or drain contacts 230.

Figure 4F:
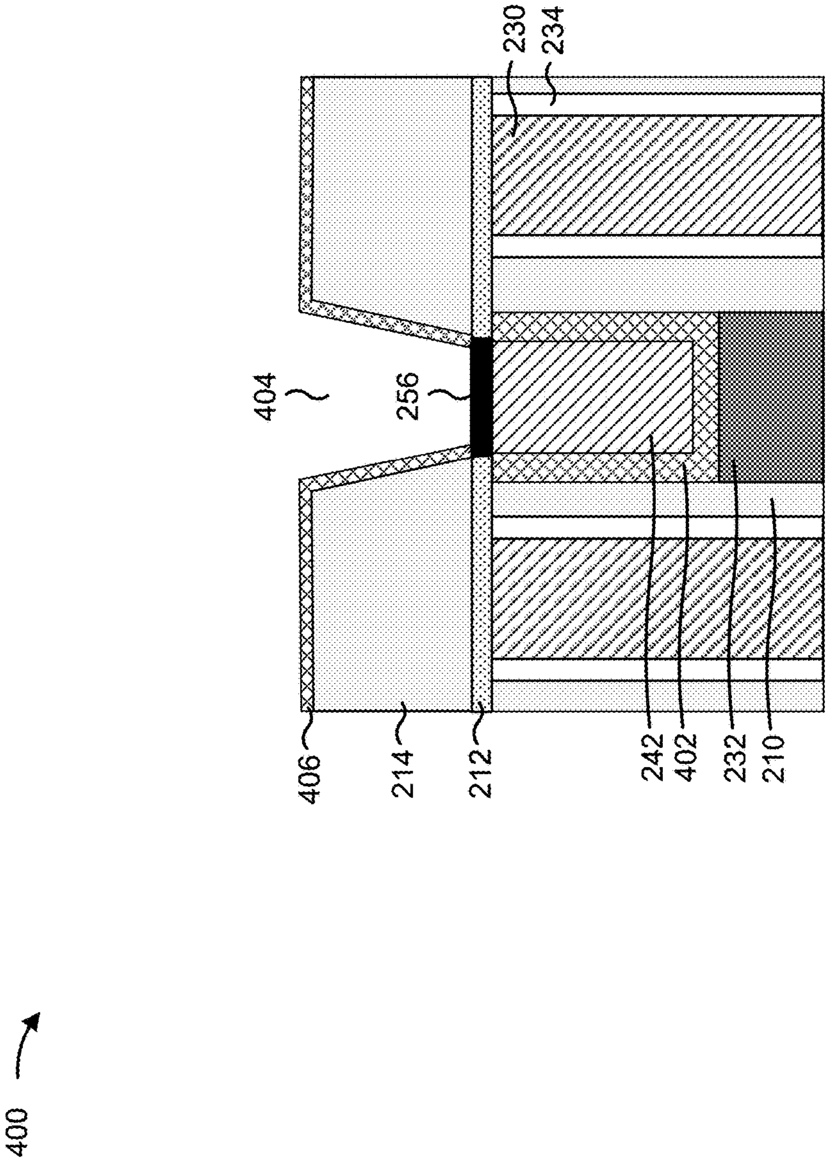

As shown in FIG. 4F, a barrier layer 406 may be formed on sidewalls of the recess 404 (and, in some implementations, over at least a portion of the oxide layer 214). The deposition tool 102 may deposit the barrier layer 406 by a CVD technique, a PVD technique, an ALD technique, or another type of deposition technique. In some implementations, the barrier layer 406 is selectively deposited on the sidewalls of the recess 404 but not on the carbon-based layer 256. For example, the barrier layer 406 may be deposited using precursor materials that react with dielectrics (and thus the oxide layer 214) but not with organic materials (and thus not the carbon-based layer 256). By preventing formation of the barrier layer 406 on the gate contact 242, the carbon-based layer 256 reduces contact resistance at the gate contact 242. The planarization tool 110 may planarize at least a portion of the barrier layer 406 after the barrier layer 406 is deposited.

Figure 4G:
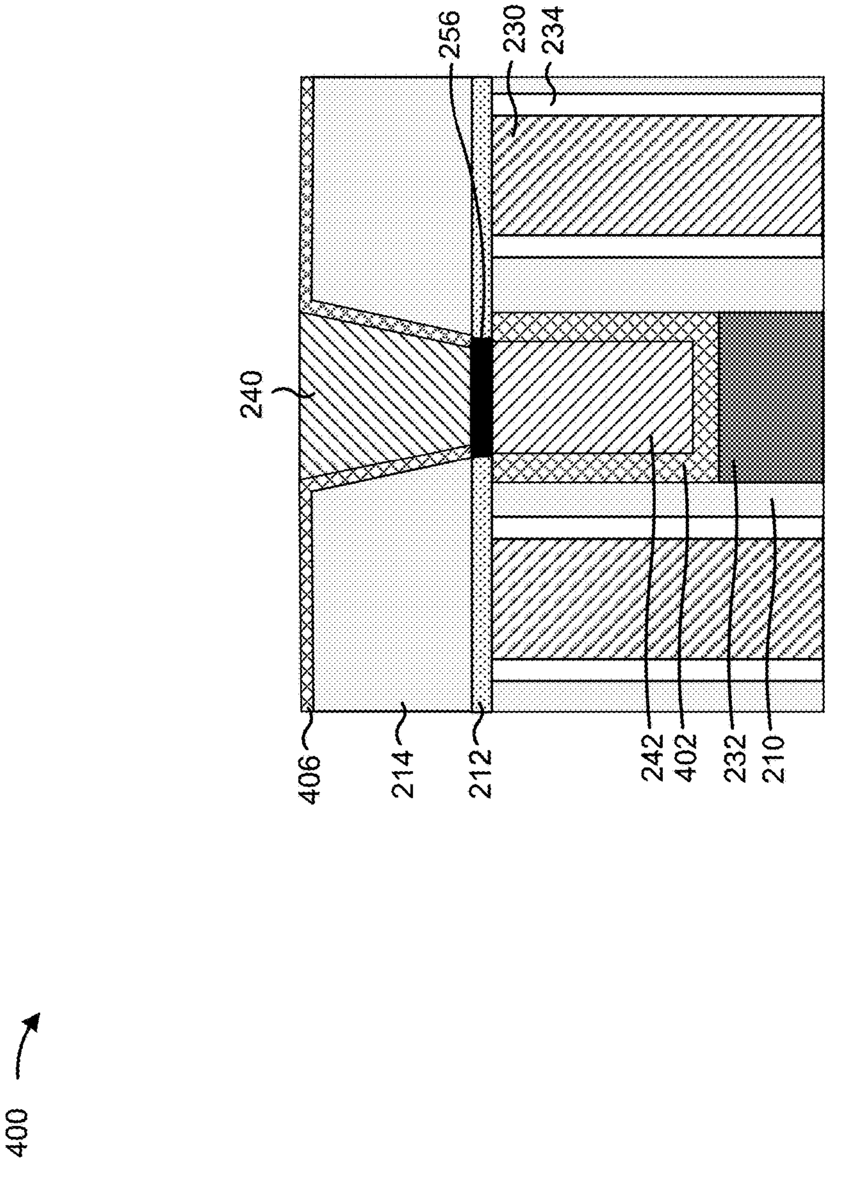

As shown in FIG. 4G, an interconnect 240 may be formed in the recess 404 and over the carbon-based layer 256. The deposition tool 102 may deposit the material of the interconnect 240 using a CVD technique, a PVD technique, an ALD technique, or another type of deposition technique, the plating tool 112 may deposit the material of the interconnect 240 using an electroplating operation, or a combination thereof. The planarization tool 110 may planarize the interconnect 240 after the interconnect 240 is deposited. The carbon-based layer 256 helps prevent heat diffusion during deposition of the interconnect 240, which causes more symmetric deposition of the interconnect 240 and reduces surface roughness at a metal interface between the gate contact 242 and the interconnect 240. Reducing surface roughness reduces contact resistance at the metal interface.

Although described herein with respect to forming the interconnect 240 over the carbon-based layer 256 on the gate contact 242, the description similarly applies to forming an interconnect 238 over the carbon-based layer 258 on one or more of the metal source or drain contacts 230.

By using techniques as described in connection with FIGS. 4A-4G, the barrier layer 406 prevents diffusion of metal (e.g., copper) from the interconnect 240, which reduces resistivity of the interconnect 240 and prevents failure of an electrical device including the interconnect 240. Additionally, the carbon-based layer 256 reduces contact resistance at a metal interface between the gate contact 242 and the interconnect 240.

As indicated above, FIGS. 4A-4G are provided as one or more examples. Other examples may differ from what is described with regard to FIGS. 4A-4G. For example, in some implementations, similarly as described with respect to FIGS. 6A-6F and FIGS. 7A-7G, additional carbon-based layers are formed on dummy gate contacts and/or dummy metal source or drain contacts that are within the oxide layer 210. For example, the carbon-based layer 256 may be formed prior to deposition of the ESL 212 and the oxide layer 214 such that carbon (e.g., in the form of graphene or graphite) is also deposited on dummy structures that do not contact interconnects that are formed in the oxide layer 214.

FIGS. 5A-5H are diagrams of an example implementation 500 described herein. Example implementation 500 may be an example process for forming a carbon-based layer 256. The carbon-based layer 256 reduces contact resistance, which increases electrical performance of the electronic device. Additionally, the carbon-based layer 256 is etched before deposition of an interconnect 240 over a gate contact 242, which further reduces contact resistance. Example implementation 500 may be similarly used to form a carbon-based layer 258 between a metal source or drain contact 230 and an interconnect 238.

Figure 5A:
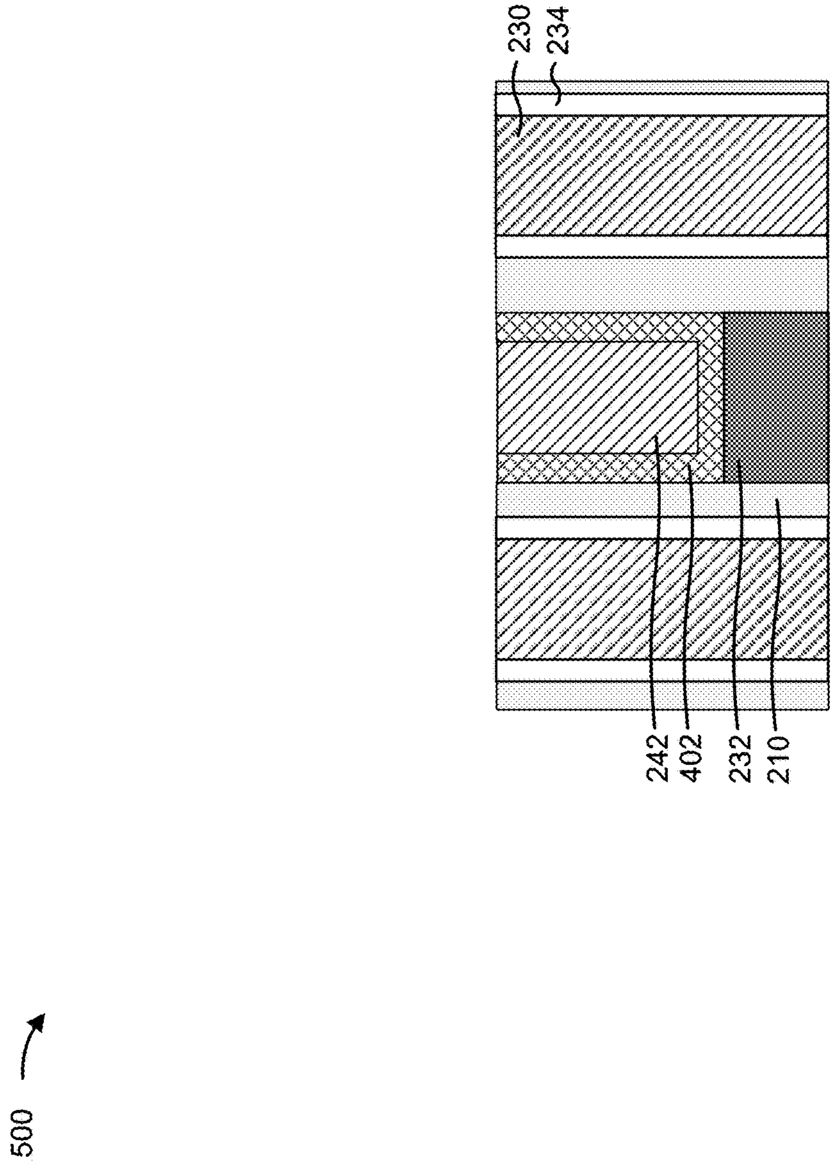
FIGS. 5A-5H are diagrams of an example implementation described herein.

As shown in FIG. 5A, the example process for forming the interconnect 240 may be performed in connection with an FEOL. In some implementations, the FEOL includes a gate contact 242 formed over a gate 232 within an oxide layer 210. Additionally, the FEOL may include one or more metal source or drain contacts 230 formed in the oxide layer 210. As shown in FIG. 5A, the metal source or drain contacts 230 may include spacers 234. In some implementations, the gate 232 may additionally include spacers 236.

In some implementations, the gate contact 242 may be surrounded (e.g., on sidewalls and/or a bottom surface) by a barrier layer 402. For example, the barrier layer 402 may include a nitride, such as titanium nitride (TiN) or tantalum nitride (TaN). In some implementations, the barrier layer 402 may have a thickness in a range from approximately 1 nm to approximately 3 nm. By selecting a thickness of at least 1 nm, diffusion of metal (e.g., copper) from the gate contact 242 can be prevented, which reduces resistivity of the gate contact 242 and prevents failure of an electrical device including the gate contact 242. Selecting a thickness of no more than 3 nm reduces contact resistance caused by the barrier layer 402.

Figure 5B:
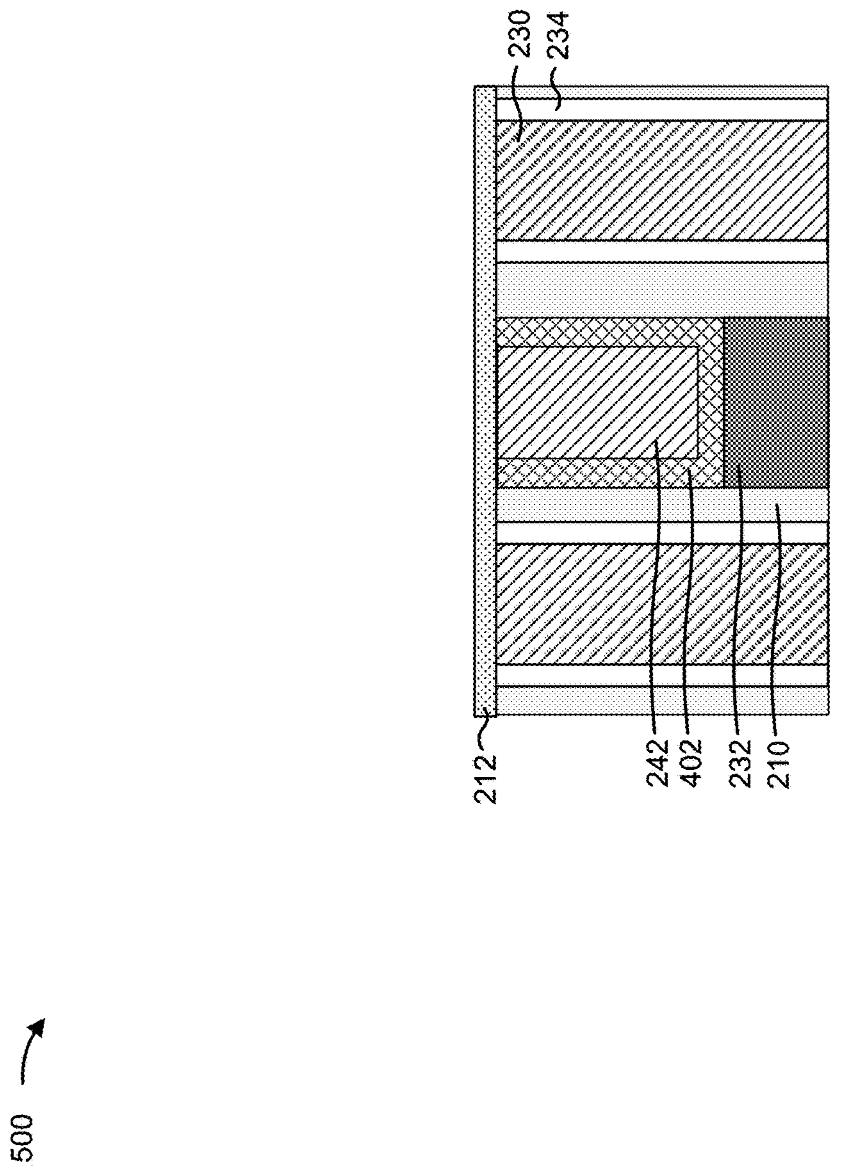

As shown in FIG. 5B, ESL 212 may be formed over the gate contact 242 and the metal source or drain contacts 230. The deposition tool 102 may deposit the ESL 212 by a CVD technique, a PVD technique, an ALD technique, or another type of deposition technique. The planarization tool 110 may planarize the ESL 212 after the ESL 212 is deposited.

In some implementations, the ESL 212 may have a thickness in a range from approximately 1 nm to approximately 3 nm. By selecting a thickness of at least 1 nm, the ESL 212 can function to prevent over-etching of layers above the ESL 212. Selecting a thickness of no more than 3 nm can prevent the ESL 212 from impeding patterning of layers above the ESL 212 (e.g., as described with respect to FIG. 5D).

Figure 5C:
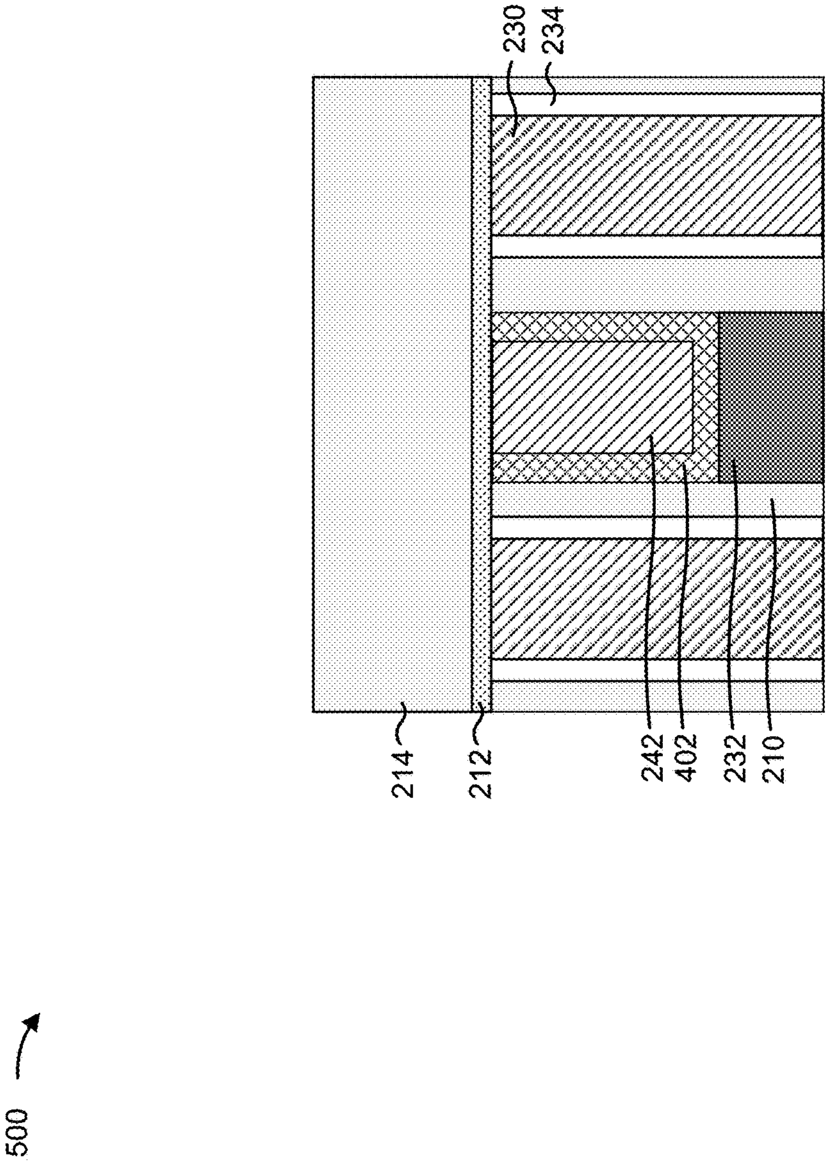

As shown in FIG. 5C, oxide layer 214 (also referred to as dielectric layer 214) may be formed over the metal source/drain 230. The deposition tool 102 may deposit the oxide layer 214 by a CVD technique, a PVD technique, an ALD technique, or another type of deposition technique. The planarization tool 110 may planarize the oxide layer 214 after the oxide layer 214 is deposited.

Figure 5D:
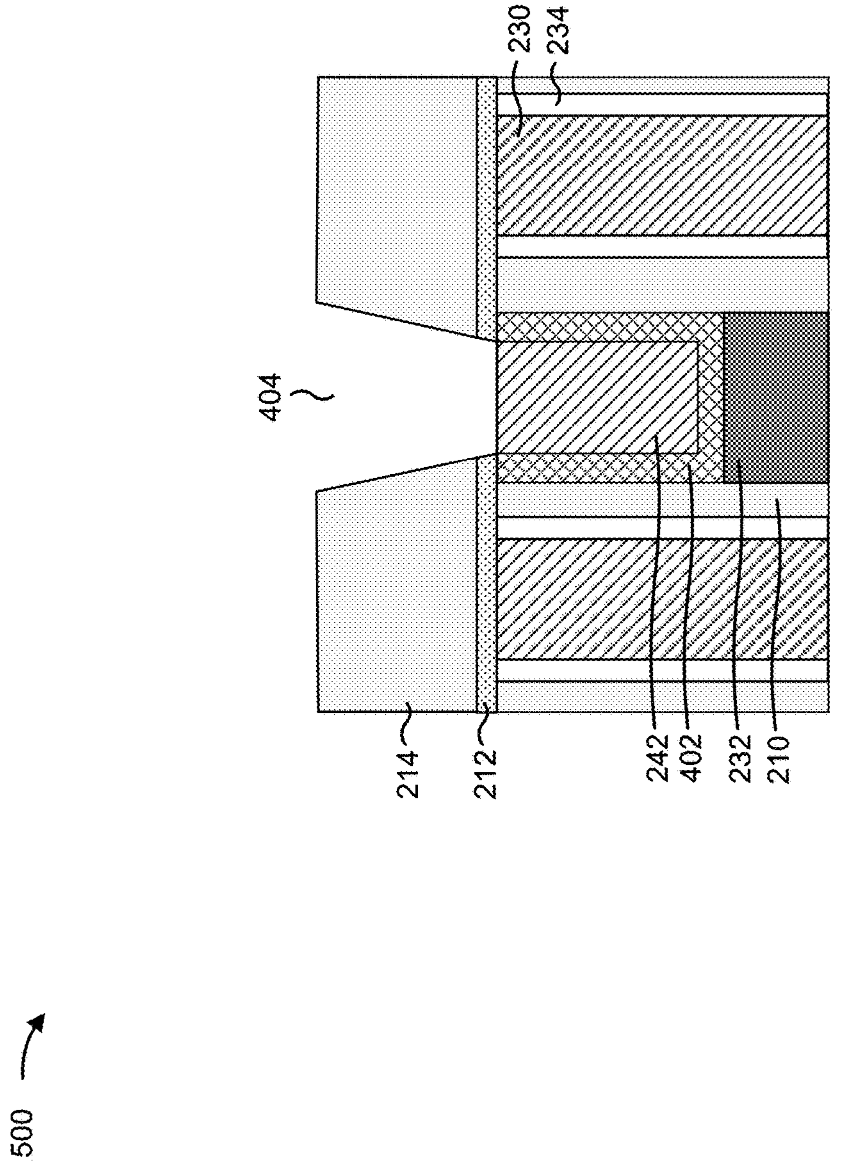

As shown in FIG. 5D, the oxide layer 214 may be etched to form an opening (resulting in recess 404) such that the gate contact 242 is at least partially exposed. For example, the deposition tool 102 may form a photoresist layer on the oxide layer 214 (or on an ESL formed on the oxide layer 214, such as ESL 216), the exposure tool 104 may expose the photoresist layer to a radiation source to pattern the photoresist layer, the developer tool 106 may develop and remove portions of the photoresist layer to expose the pattern, and the etch tool 108 may etch portions of the oxide layer 214 to form the recess 404. In some implementations, the photoresist removal tool 114 removes the remaining portions of the photoresist layer (e.g., using a chemical stripper, a plasma asher, and/or another technique) after the etch tool 108 etches the recess 404.

Although described herein with respect to forming the recess 404 in the oxide layer 214 above the gate contact 242, the description similarly applies to forming the recess 404 in the oxide layer 214 above one or more of the metal source or drain contacts 230.

Figure 5E:
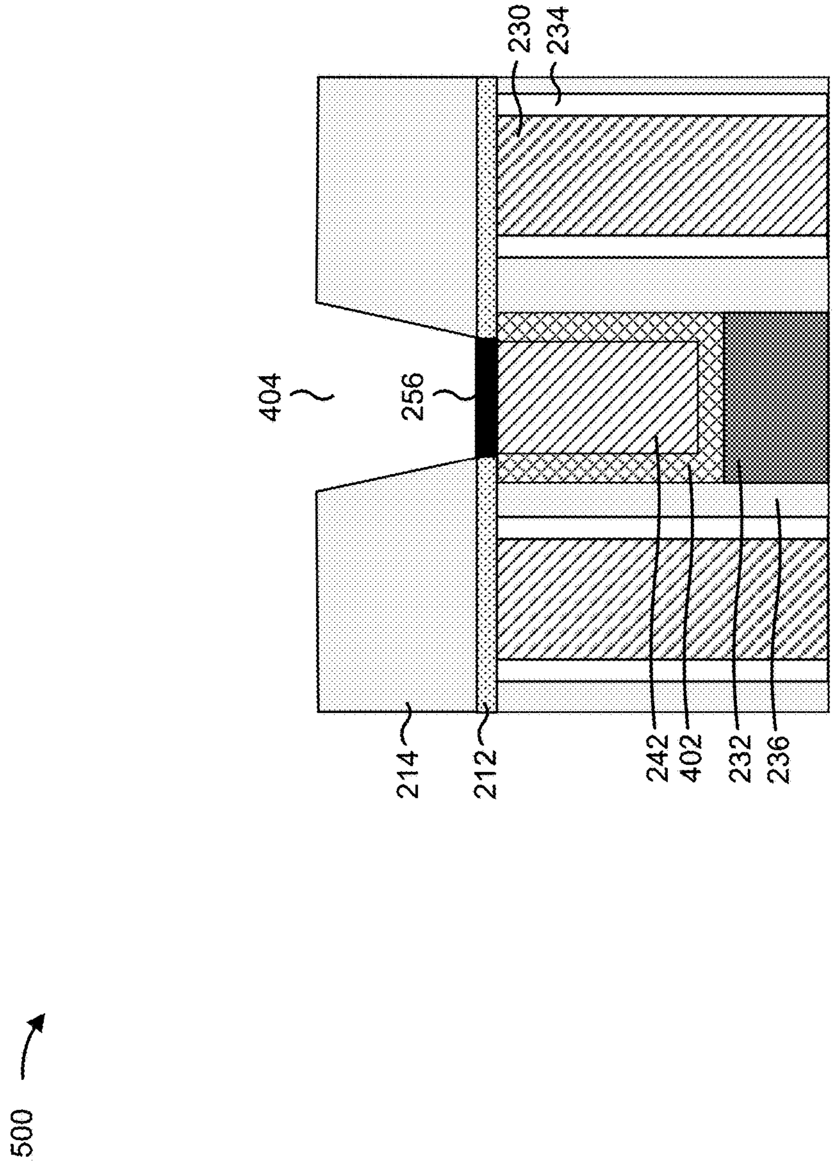

As shown in FIG. 5E, carbon-based layer 256 may be formed over the gate contact 242. The deposition tool 102 may deposit the carbon-based layer 256 by a CVD technique, a PVD technique, an ALD technique, or another type of deposition technique. In some implementations, the carbon-based layer 256 is selectively deposited on the gate contact 242, but not on the sidewalls of recess 404. For example, the carbon-based layer 256 may be deposited using organic precursor materials that react with metals (and thus the gate contact 242) but not with dielectric materials (and thus the oxide layer 214).

In some implementations, the carbon-based layer 256 may have a thickness in a range from approximately 1 nm to approximately 5 nm. By selecting a thickness of at least 1 nm, the carbon-based layer 256 prevents barrier layer 406 (as described with respect to FIG. 5F) from forming on the gate contact 242. Preventing the barrier layer 406 from depositing on the gate contact 242 reduces contact resistance at the gate contact 242. By selecting a depth of no more than 5 nm, an amount of time, power, and chemicals used to etch the carbon-based layer 256 (as described with respect to FIG. 5G) is reduced.

Although described herein with respect to forming the carbon-based layer 256 on the gate contact 242, the description similarly applies to forming a carbon-based layer 258 on one or more of the metal source or drain contacts 230.

Figure 5F:
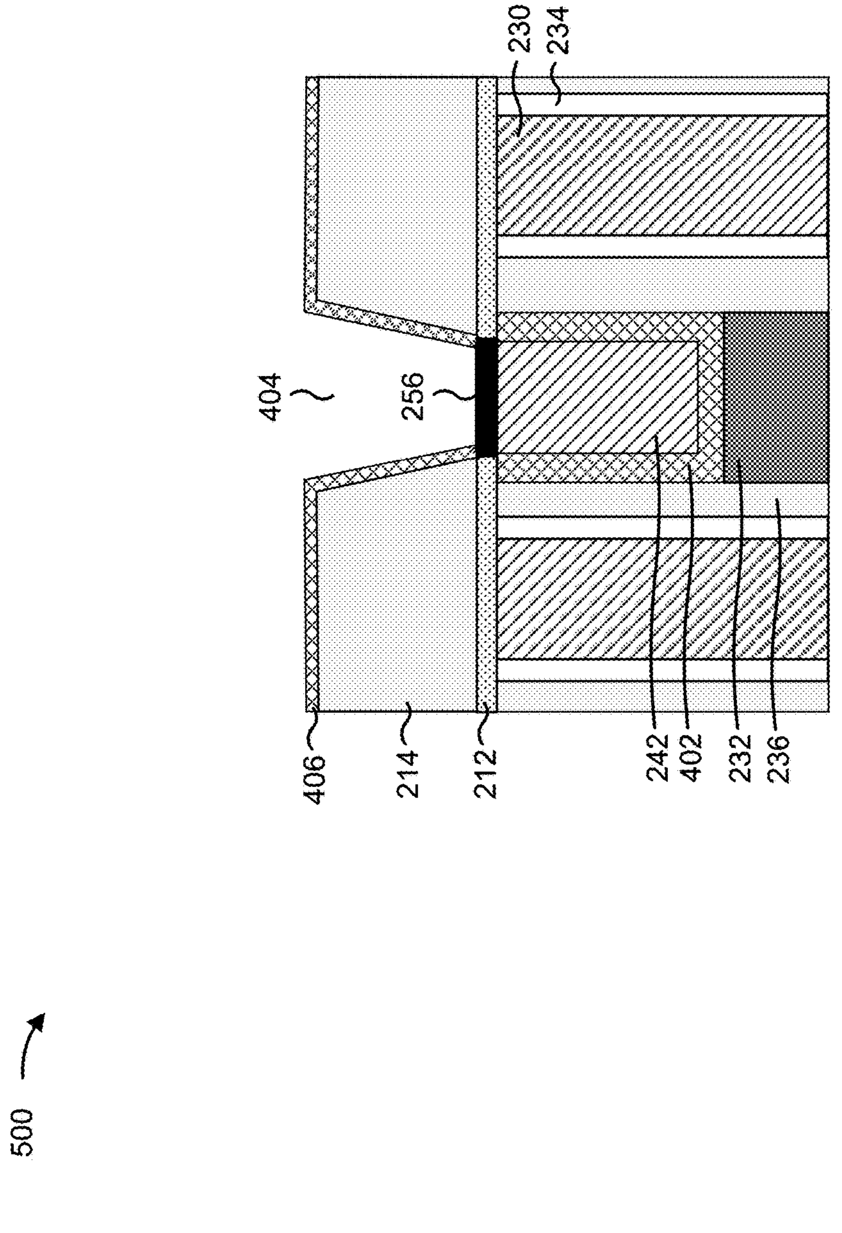

As shown in FIG. 5F, a barrier layer 406 may be formed on sidewalls of the recess 404 (and, in some implementations, over at least a portion of the oxide layer 214). The deposition tool 102 may deposit the barrier layer 406 by a CVD technique, a PVD technique, an ALD technique, or another type of deposition technique. In some implementations, the barrier layer 406 is selectively deposited on the sidewalls of the recess 404 but not on the carbon-based layer 256. For example, the barrier layer 406 may be deposited using precursor materials that react with dielectrics (and thus the oxide layer 214) but not with organic materials (and thus not the carbon-based layer 256). By preventing formation of the barrier layer 406 on the gate contact 242, the carbon-based layer 256 reduces contact resistance at the gate contact 242. The planarization tool 110 may planarize at least a portion of the barrier layer 406 after the barrier layer 406 is deposited.

Figure 5G:
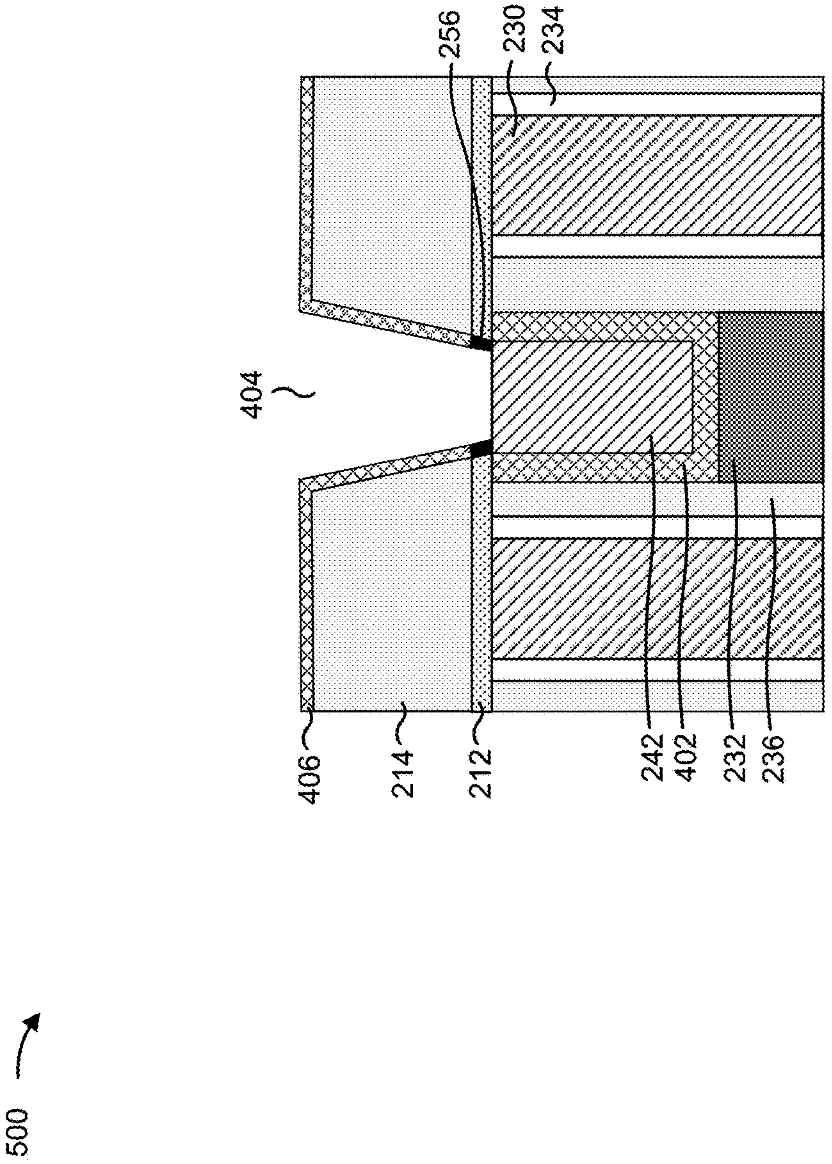

As shown in FIG. 5G, the carbon-based layer 256 may be etched. For example, the etch tool 108 may use one or more etching agents that react with organic materials (and thus the carbon-based layer 256) and not with inorganic materials (and thus not the barrier layer 406 and the gate contact 242). As further shown in FIG. 5G, a portion of the carbon-based layer 256 may remain between the barrier layer 406 and the gate contact 242.

Figure 5H:
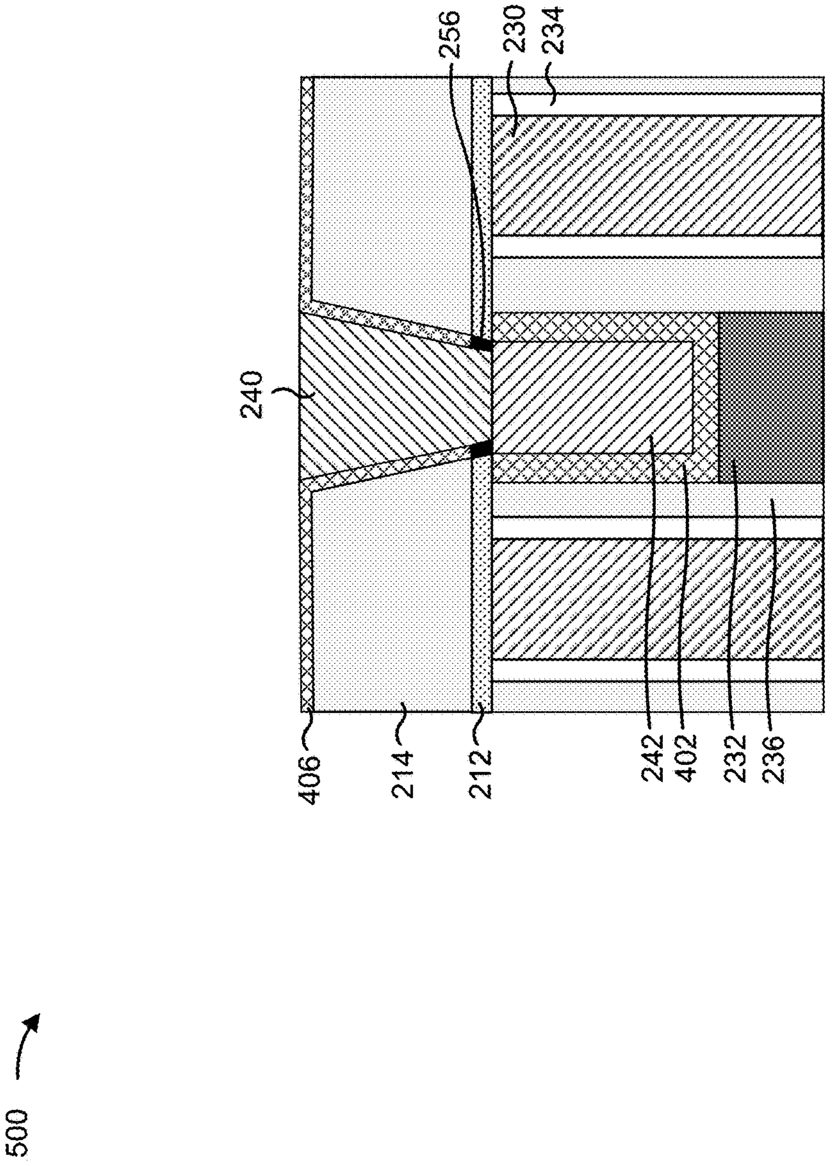

As shown in FIG. 5H, an interconnect 240 may be formed in the recess 404 and over the gate contact 242. The deposition tool 102 may deposit the material of the interconnect 240 using a CVD technique, a PVD technique, an ALD technique, or another type of deposition technique, the plating tool 112 may deposit the material of the interconnect 240 using an electroplating operation, or a combination thereof. The planarization tool 110 may planarize the interconnect 240 after the interconnect 240 is deposited. Because the carbon-based layer 256 was etched, contact resistance at a metal interface between the interconnect 240 and the gate contact 242 is further reduced.

Although described herein with respect to forming the interconnect 240 over the gate contact 242, the description similarly applies to forming an interconnect 238 over one or more of the metal source or drain contacts 230.

By using techniques as described in connection with FIGS. 5A-5H, the barrier layer 406 prevents diffusion of metal (e.g., copper) from the interconnect 240, which reduces resistivity of the interconnect 240 and prevents failure of an electrical device including the interconnect 240. Additionally, the carbon-based layer 256 prevents deposition of the barrier layer 406 at the metal interface between the interconnect 240 and the gate contact 242, which reduces contact resistance at the metal interface. The carbon-based layer 256 is also etched before deposition of the interconnect 240 to further reduce contact resistance at the metal interface.

As indicated above, FIGS. 5A-5H are provided as one or more examples. Other examples may differ from what is described with regard to FIGS. 5A-5H. For example, in some implementations, similarly as described with respect to FIGS. 6A-6F and FIGS. 7A-7G, additional carbon-based layers are formed on dummy gate contacts and/or dummy metal source or drain contacts that are within the oxide layer 210. For example, the carbon-based layer 256 may be formed prior to deposition of the ESL 212 and the oxide layer 214 such that carbon (e.g., in the form of graphene or graphite) is also deposited on dummy structures that do not contact interconnects that are formed in the oxide layer 214.

FIGS. 6A-6F are diagrams of an example implementation 600 described herein. Example implementation 600 may be an example process for forming a carbon-based layer 262. The carbon-based layer 262 reduces contact resistance, which increases electrical performance of the electronic device. Additionally, the carbon-based layer 262 helps prevent heat transfer during deposition of a metallization layer 246 over a contact plug 240. This results in more symmetric deposition of the metallization layer 246, which further reduces contact resistance. Example implementation 600 may be similarly used to form a carbon-based layer 260 between a metallization layer 244 and a contact plug 238, a carbon-based layer between a via 248 and a metallization layer 244, and/or a carbon-based layer 264 between a via 250 and a metallization layer 246.

Figure 6A:
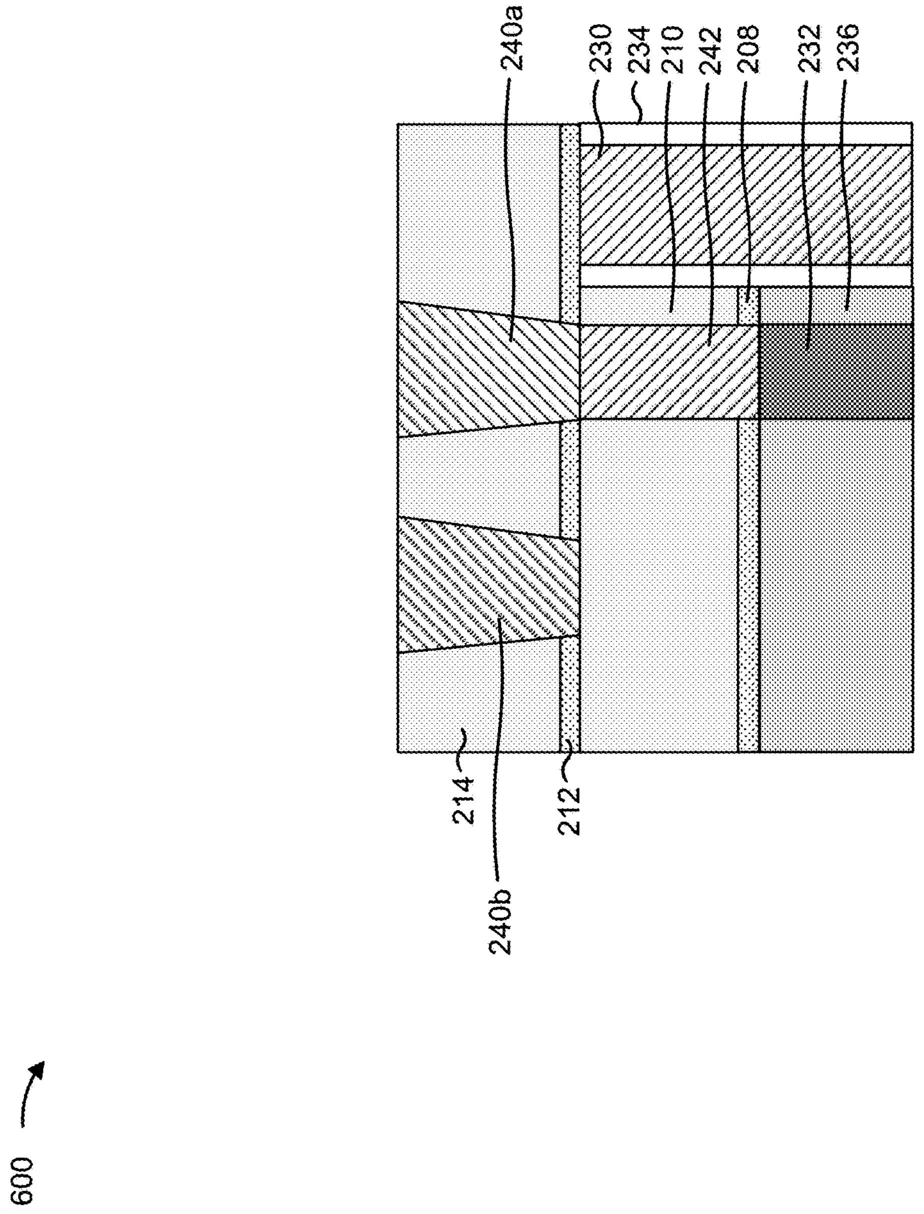
FIGS. 6A-6F are diagrams of an example implementation described herein.

As shown in FIG. 6A, the example process for forming the metallization layer 246 may be performed in connection with an FEOL. In some implementations, the FEOL includes a gate contact 242 formed over a gate 232 within an oxide layer 210. Additionally, the FEOL may include one or more metal source or drain contacts 230 formed in the oxide layer 210. As shown in FIG. 6A, the metal source or drain contacts 230 may include spacers 234, and the gate 232 may include spacers 236. In some implementations, and as further shown in FIG. 6A, an ESL 208 is deposited between the oxide layer 210 and the spacers 236. In some implementations, and as described in connection with FIGS. 4A-4G and FIGS. 5A-5H, the gate contact 242 is surrounded by a barrier layer.

As further shown in FIG. 6A, the example process for forming the metallization layer 246 may be performed in connection with an MEOL. In some implementations, the MEOL includes a contact plug 240*a* formed over the gate contact 242 within an oxide layer 214. In some implementations, and as described in connection with FIGS. 4A-4G and FIGS. 5A-5H, the contact plug 240*a* is surrounded by a barrier layer and/or interfaces with the gate contact 242 at a carbon-based layer 256.

In some implementations, and as further shown in FIG. 6A, an ESL 212 is deposited between the oxide layer 214 and the oxide layer 210. Additionally, the MEOL may include one or more dummy structures, such as dummy contact plug 240*b*. As shown in FIG. 6A, the dummy contact plug 240*b* does not electrically connect to a gate contact or to a metal source or drain contact.

Figure 6B:
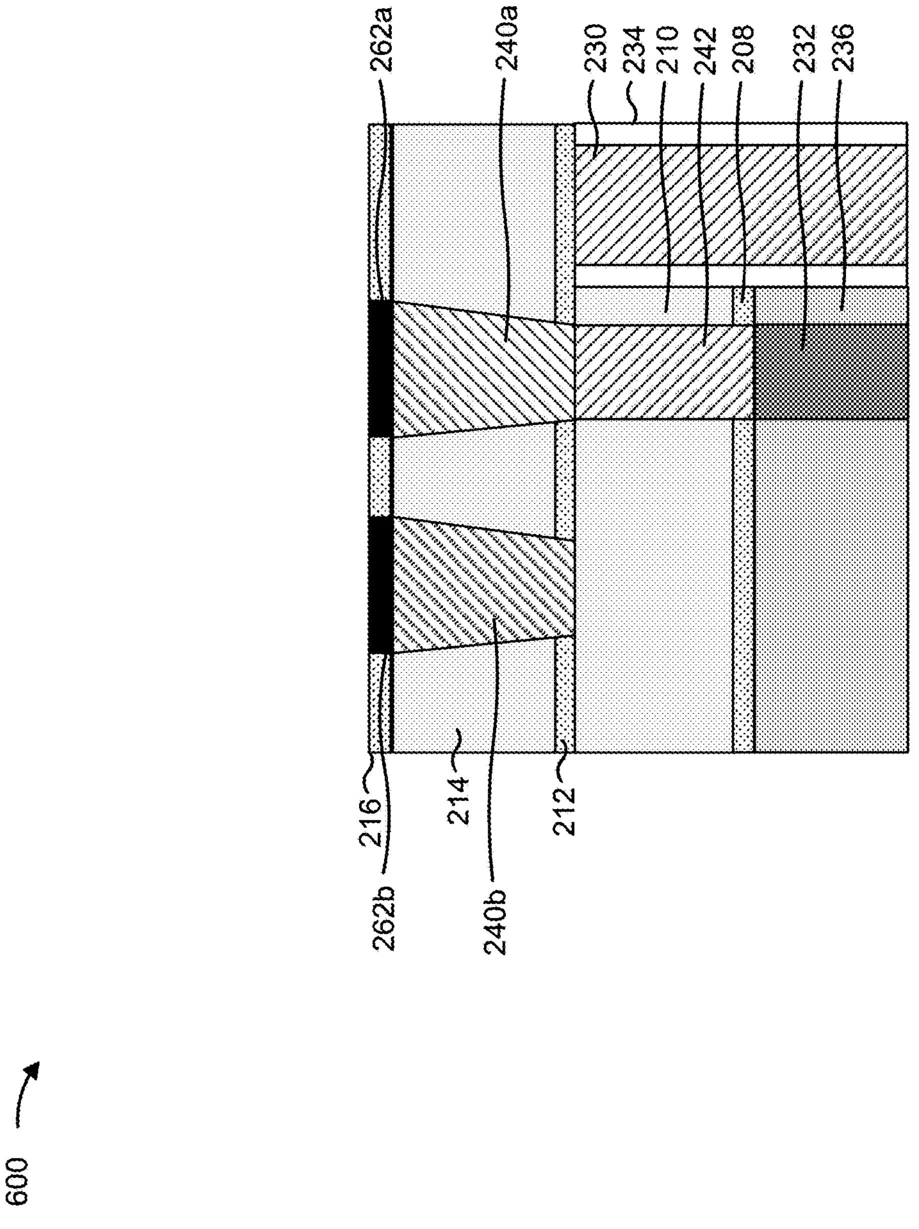

As shown in FIG. 6B, carbon-based layer 262*a* may be formed over the contact plug 240*a*, and carbon-based layer 262*b* may be formed over the dummy contact plug 240*b*. The deposition tool 102 may deposit the carbon-based layers 262*a* and 262*b* by a CVD technique, a PVD technique, an ALD technique, or another type of deposition technique. In some implementations, the carbon-based layers 262*a* and 262*b* are selectively deposited on the contact plug 240*a* and the dummy contact plug 240*b*, but not on the oxide layer 214. For example, the carbon-based layers 262*a* and 262*b* may be deposited using organic precursor materials that react with metals (and thus the contact plug 240*a* and the dummy contact plug 240*b*) but not with dielectric materials (and thus not the oxide layer 214).

In some implementations, the carbon-based layer 262*a* (and similarly the carbon-based layer 262*b*) may have a thickness in a range from approximately 1 nm to approximately 5 nm. By selecting a thickness of at least 1 nm, the carbon-based layer 262*a* prevents barrier layer 606 (as described with respect to FIG. 6E) from forming on the contact plug 240*a*. Preventing the barrier layer 606 from depositing on the contact plug 240*a* reduces contact resistance at the contact plug 240*a*. Selecting a depth of at least 1 nm also prevents heat transfer during deposition of metallization layer 246*a* (as described with respect to FIG. 6F), resulting in more symmetric deposition of the metallization layer 246*a*, which further reduces contact resistance. By selecting a depth of no more than 5 nm, the carbon-based layer 262*a* does not significantly increase contact resistance at the contact plug 240*a*.

Although described herein with respect to forming the carbon-based layer 262*a* on the contact plug 240*a* (and carbon-based layer 262*b* on the dummy contact plug 240*b*), the description similarly applies to forming a carbon-based layer 260 on the contact plug 238.

As further shown in FIG. 6B, ESL 216 may be formed over the oxide layer 214. The deposition tool 102 may deposit the ESL 216 by a CVD technique, a PVD technique, an ALD technique, or another type of deposition technique. The planarization tool 110 may planarize the ESL 216 after the ESL 216 is deposited.

In some implementations, the ESL 216 may have a thickness in a range from approximately 1 nm to approximately 3 nm. By selecting a thickness of at least 1 nm, the ESL 216 can function to prevent over-etching of layers above the ESL 216. Selecting a thickness of no more than 3 nm can prevent epitaxial growth of the ESL 216 over the carbon-based layer 262*a*, which prevents the ESL 216 from increasing contact resistance at the contact plug 240*a*.

Although described as a single ESL layer with a thickness in a range from approximately 1 nm to approximately 3 nm, the ESL 216 may include one or more additional layers. For example, the ESL 216 may include an additional silicon-based layer with a thickness in a range from approximately 1 nm to approximately 5 nm and/or an additional aluminum-based layer with a thickness in a range from approximately 1 nm to approximately 3 nm.

Figure 6C:
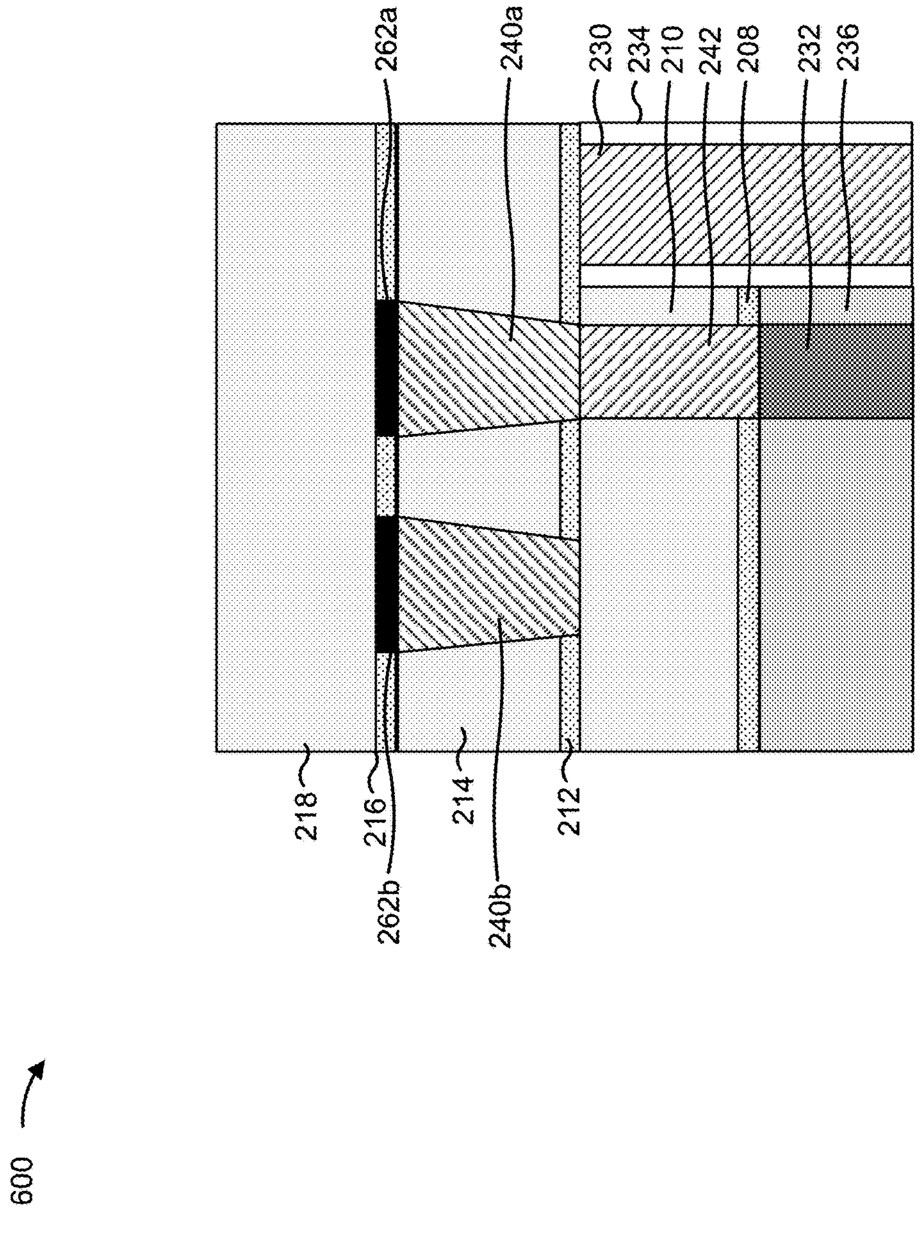

As shown in FIG. 6C, oxide layer 218 (also referred to as dielectric layer 218) may be formed over the ESL 216. The deposition tool 102 may deposit the oxide layer 218 by a CVD technique, a PVD technique, an ALD technique, or another type of deposition technique. The planarization tool 110 may planarize the oxide layer 218 after the oxide layer 218 is deposited.

Figure 6D:
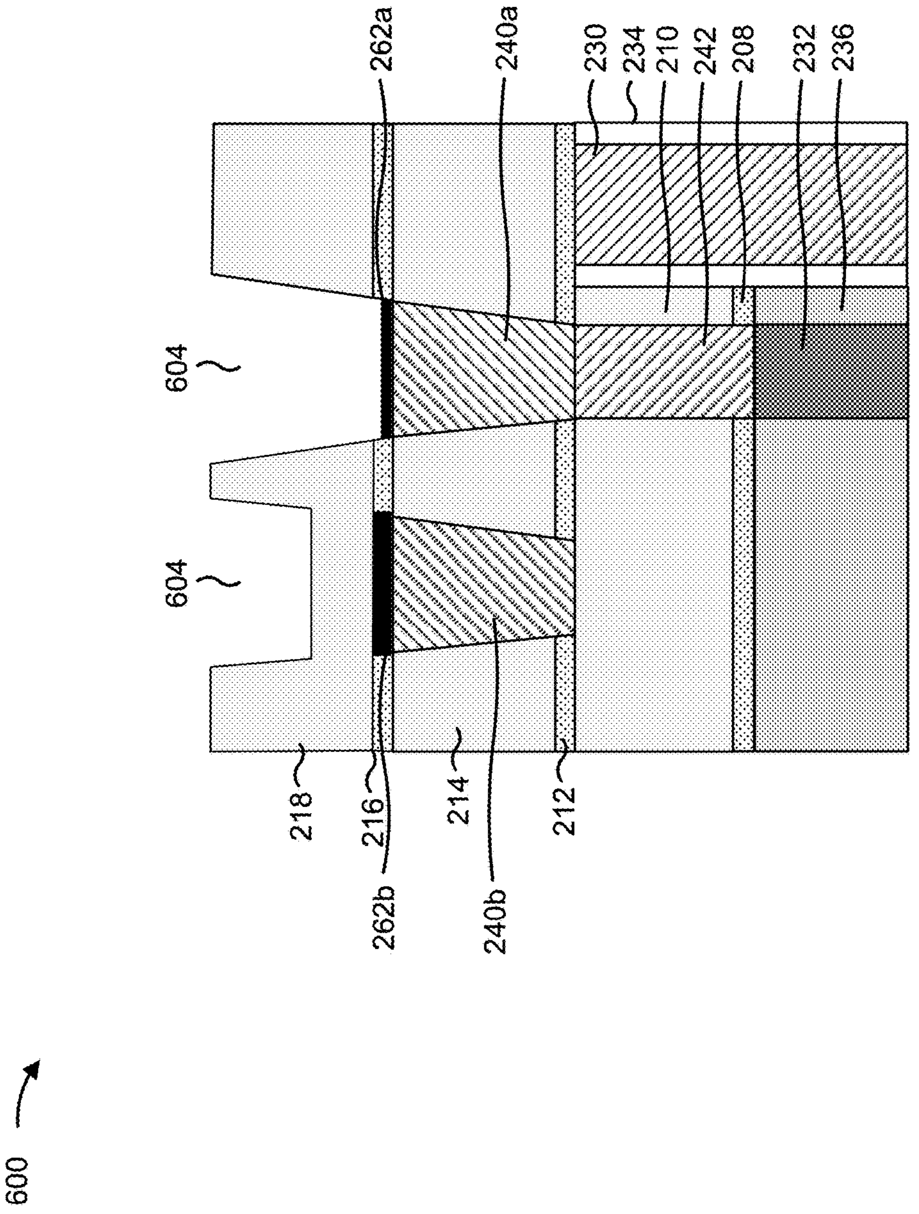

As shown in FIG. 6D, the oxide layer 218 may be etched to form openings (resulting in recesses 604). The recesses 604 may be etched such that the carbon-based layer 262*a* is at least partially exposed but the carbon based layer 262*b* is not. For example, the deposition tool 102 may form a photoresist layer on the oxide layer 218 (or on an ESL formed on the oxide layer 218, such as ESL 220), the exposure tool 104 may expose the photoresist layer to a radiation source to pattern the photoresist layer, the developer tool 106 may develop and remove portions of the photoresist layer to expose the pattern, and the etch tool 108 may etch portions of the oxide layer 218 to form the recesses 604. In some implementations, the photoresist removal tool 114 removes the remaining portions of the photoresist layer (e.g., using a chemical stripper, a plasma asher, and/or another technique) after the etch tool 108 etches the recesses 604.

Although described herein with respect to forming the recesses 604 in the oxide layer 218 above the contact plug 240*a* (and the dummy contact plug 240*b*), the description similarly applies to forming the recesses 604 in the oxide layer 218 above the contact plug 238.

Figure 6E:
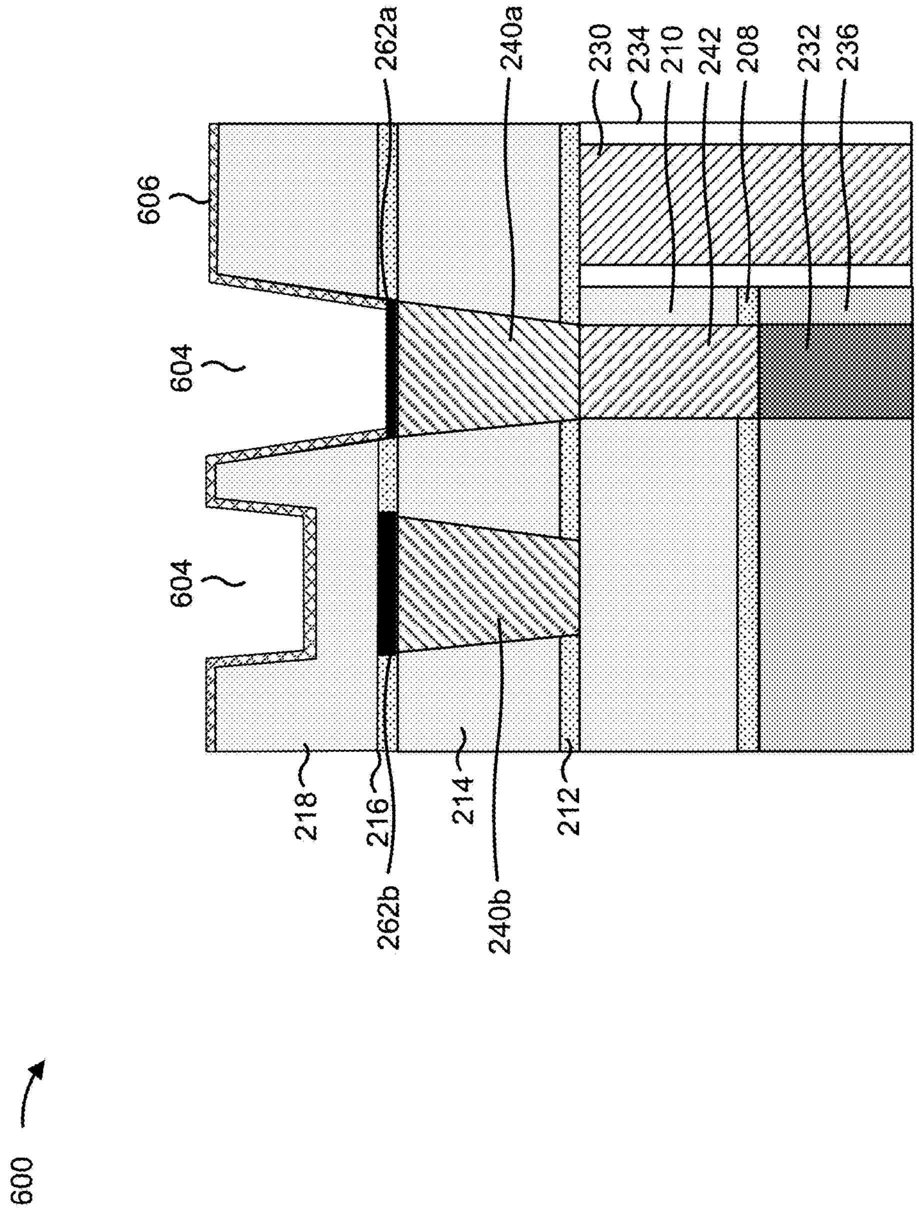

As shown in FIG. 6E, a barrier layer 606 may be formed on sidewalls of the recesses 604 (and, in some implementations, over at least a portion of the oxide layer 218). The deposition tool 102 may deposit the barrier layer 606 by a CVD technique, a PVD technique, an ALD technique, or another type of deposition technique. In some implementations, the barrier layer 606 is selectively deposited on the sidewalls of the recesses 604 but not on the carbon-based layer 262*a*. For example, the barrier layer 606 may be deposited using precursor materials that react with dielectrics (and thus the oxide layer 218) but not with organic materials (and thus not the carbon-based layer 262*a*). By preventing formation of the barrier layer 606 on the contact plug 240*a*, the carbon-based layer 262*a* reduces contact resistance at the contact plug 240*a*. The planarization tool 110 may planarize at least a portion of the barrier layer 606 after the barrier layer 606 is deposited.

Figure 6F:
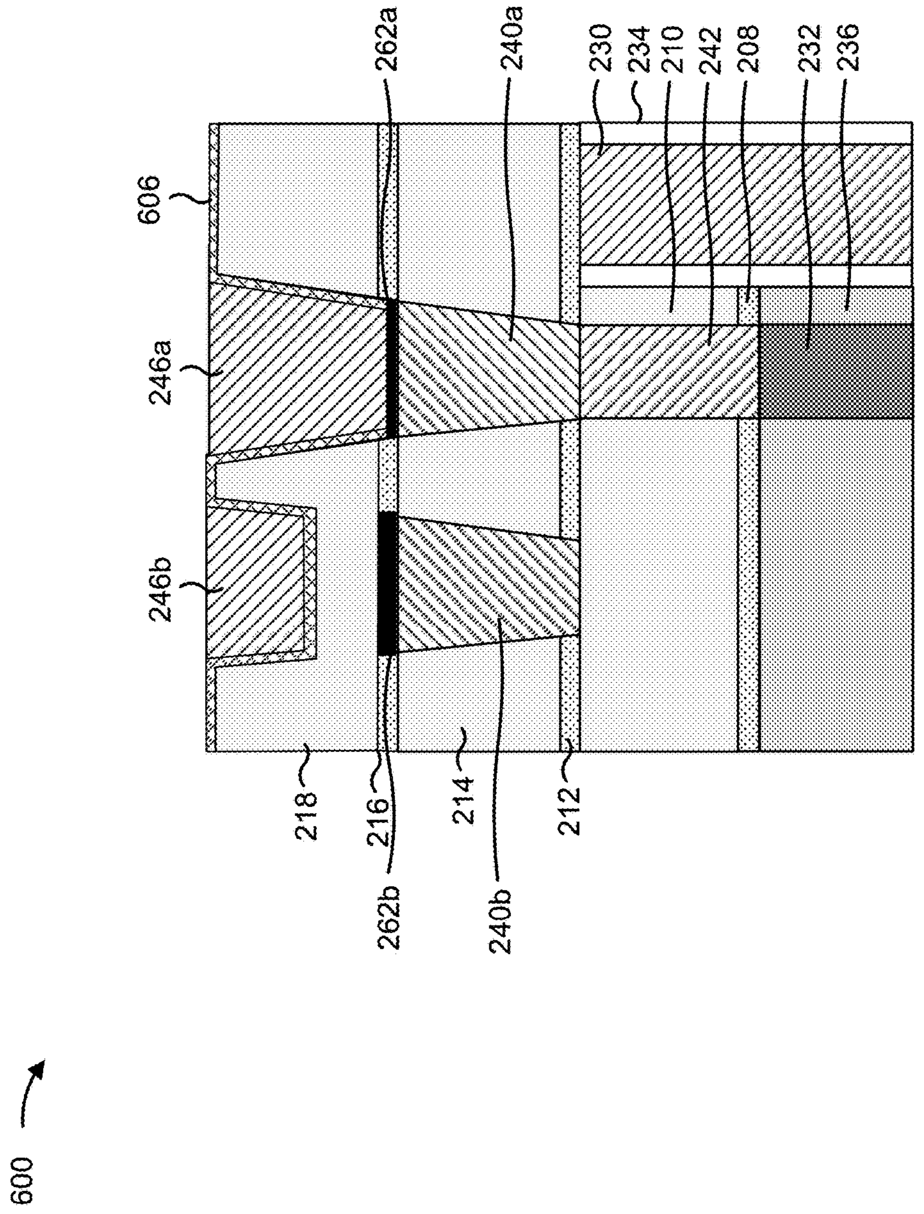

As shown in FIG. 6F, a metallization layer 246*a* and a dummy metallization layer 246*b* may be formed in the recesses 604. The metallization layer 246*a* may be formed over the carbon-based layer 262*a* and thus electrically connect with the contact plug 240*a* while the dummy metallization layer 246*b* does not contact the carbon-based layer 262*b* and is electrically insulated from the dummy contact plug 240*b*. The deposition tool 102 may deposit the material of the metallization layer 246*a* and the dummy metallization layer 246*b* using a CVD technique, a PVD technique, an ALD technique, or another type of deposition technique, the plating tool 112 may deposit the material of the metallization layer 246*a* and the dummy metallization layer 246*b* using an electroplating operation, or a combination thereof. The planarization tool 110 may planarize the metallization layer 246*a* and the dummy metallization layer 246*b* after deposition. The carbon-based layer 262*a* helps prevent heat diffusion during deposition of the metallization layer 246*a*, which causes more symmetric deposition of the metallization layer 246*a* and reduces surface roughness at a metal interface between the contact plug 240*a* and the metallization layer 246*a*. Reducing surface roughness reduces contact resistance at the metal interface.

Although described herein with respect to forming the metallization layer 246*a* over the carbon-based layer 262*a* on the contact plug 240*a* (and the dummy metallization layer 246*b* over but not contacting the carbon-based layer 262*b*), the description similarly applies to forming a metallization layer 244 over the carbon-based layer 260 on the contact plug 238.

By using techniques as described in connection with FIGS. 6A-6F, the barrier layer 606 prevents diffusion of metal (e.g., copper) from the contact plug 240*a*, which reduces resistivity of the contact plug 240*a* and prevents failure of an electrical device including the contact plug 240*a*. Additionally, the carbon-based layer 262*a* reduces contact resistance at a metal interface between the contact plug 240*a* and the metallization layer 246*a*.

As indicated above, FIGS. 6A-6F are provided as one or more examples. Other examples may differ from what is described with regard to FIGS. 6A-6F. For example, in some implementations, similarly as described with respect to FIGS. 4A-4G and FIGS. 5A-5H, the carbon-based layer 262*a* may be formed after deposition of the ESL 216 and the oxide layer 218 such that carbon (e.g., in the form of graphene or graphite) is not deposited on dummy contact plug 240*b*.

FIGS. 7A-7G are diagrams of an example implementation 700 described herein. Example implementation 700 may be an example process for forming a carbon-based layer 262. The carbon-based layer 262 reduces contact resistance, which increases electrical performance of the electronic device. Additionally, the carbon-based layer 262 is etched before deposition of a metallization layer 246 over a contact plug 240, which further reduces contact resistance. Example implementation 700 may be similarly used to form a carbon-based layer 260 between a metallization layer 244 and a contact plug 238, a carbon-based layer between a via 248 and a metallization layer 244, and/or a carbon-based layer 264 between a via 250 and a metallization layer 246.

Figure 7A:
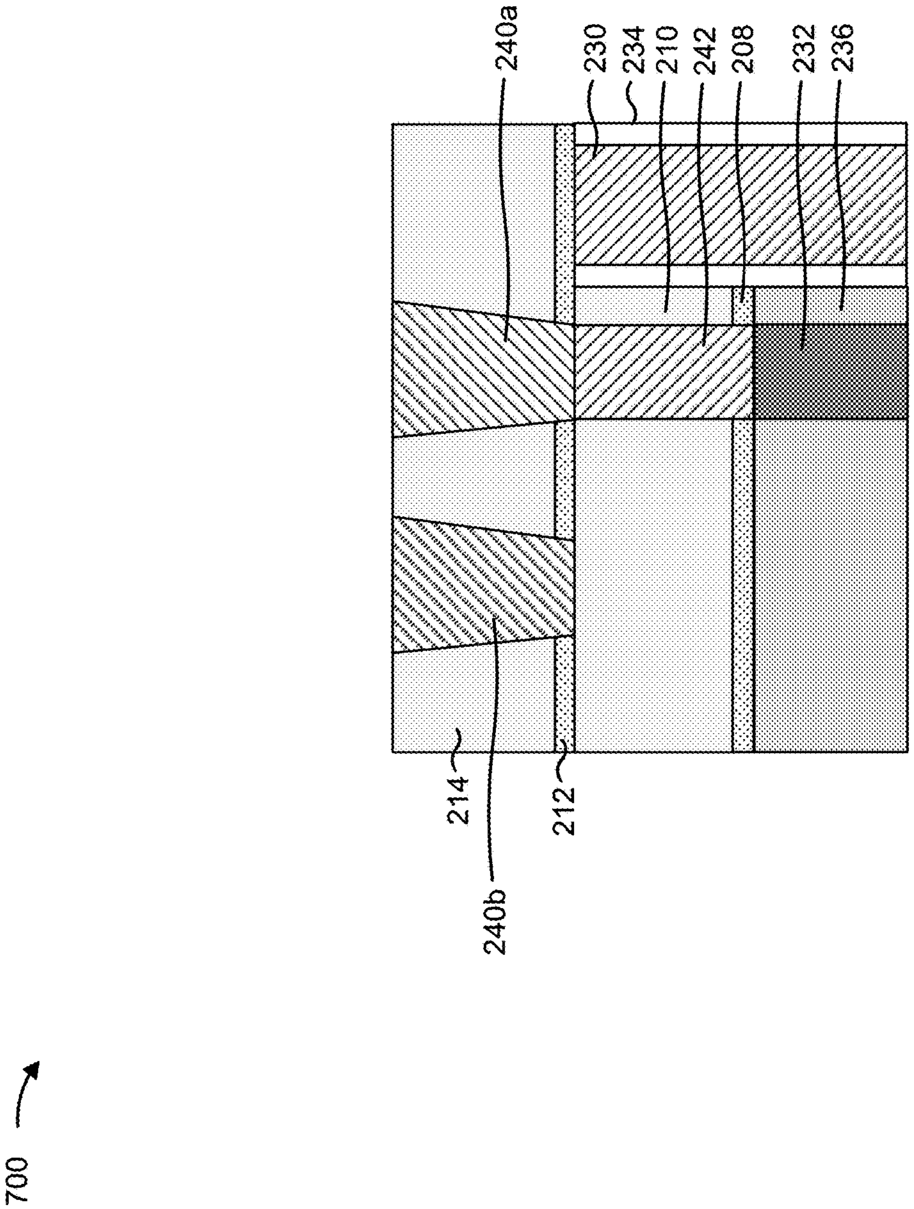
FIGS. 7A-7G are diagrams of an example implementation described herein.

As shown in FIG. 7A, the example process for forming the metallization layer 246 may be performed in connection with an FEOL. In some implementations, the FEOL includes a gate contact 242 formed over a gate 232 within an oxide layer 210. Additionally, the FEOL may include one or more metal source or drain contacts 230 formed in the oxide layer 210. As shown in FIG. 7A, the metal source or drain contacts 230 may include spacers 234, and the gate 232 may include spacers 236. In some implementations, and as further shown in FIG. 7A, an ESL 208 is deposited between the oxide layer 210 and the spacers 236. In some implementations, and as described in connection with FIGS. 4A-4G and FIGS. 5A-5H, the gate contact 242 is surrounded by a barrier layer.

As further shown in FIG. 7A, the example process for forming the metallization layer 246 may be performed in connection with an MEOL. In some implementations, the MEOL includes a contact plug 240*a* formed over the gate contact 242 within an oxide layer 214. In some implementations, and as described in connection with FIGS. 4A-4G and FIGS. 5A-5H, the contact plug 240*a* is surrounded by a barrier layer and/or interfaces with the gate contact 242 at a carbon-based layer 256.

In some implementations, and as further shown in FIG. 7A, an ESL 212 is deposited between the oxide layer 214 and the oxide layer 210. Additionally, the MEOL may include one or more dummy structures, such as dummy contact plug 240*b*. As shown in FIG. 7A, the dummy contact plug 240*b* does not electrically connect to a gate contact or to a metal source or drain contact.

Figure 7B:
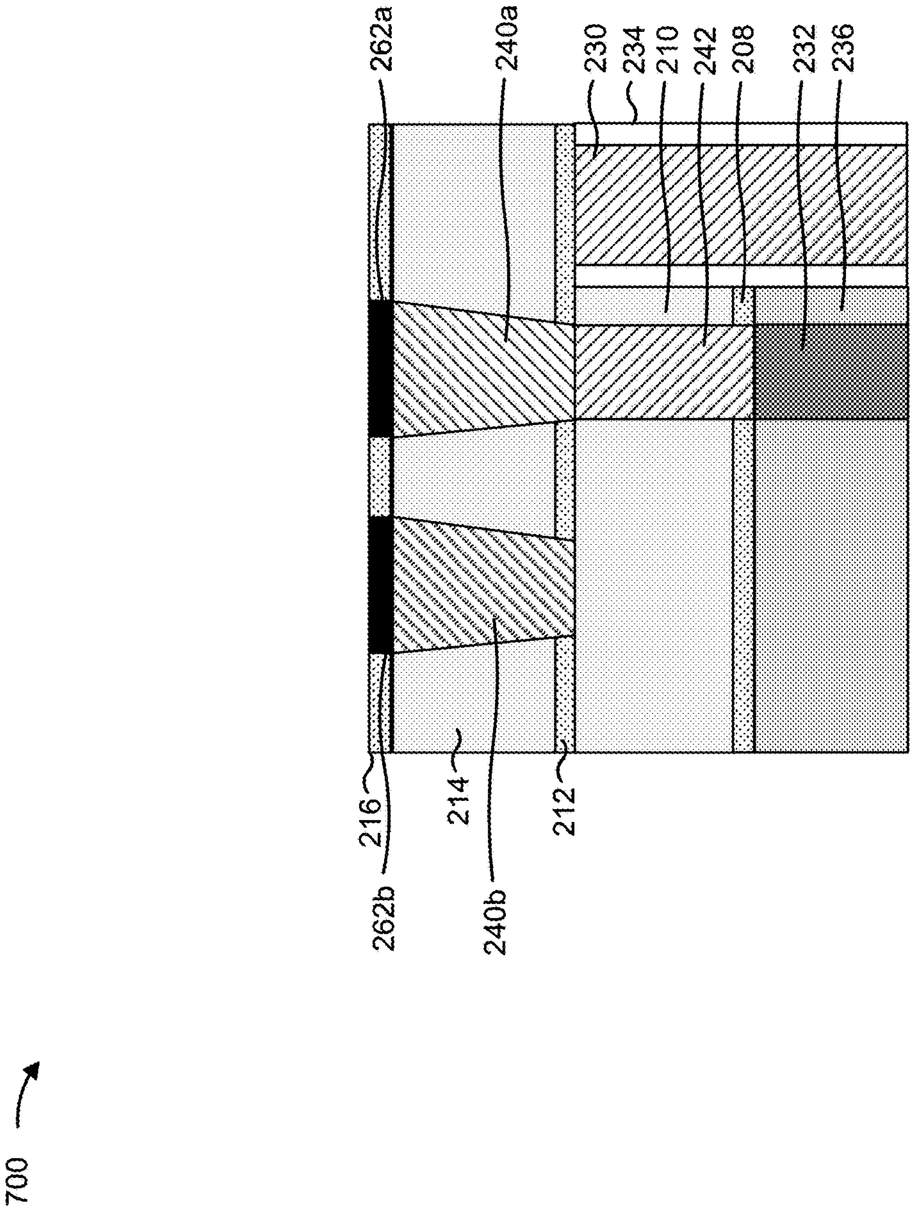

As shown in FIG. 7B, carbon-based layer 262*a* may be formed over the contact plug 240*a*, and carbon-based layer 262*b* may be formed over the dummy contact plug 240*b*. The deposition tool 102 may deposit the carbon-based layers 262*a* and 262*b* by a CVD technique, a PVD technique, an ALD technique, or another type of deposition technique. In some implementations, the carbon-based layers 262*a* and 262*b* are selectively deposited on the contact plug 240*a* and the dummy contact plug 240*b*, but not on the oxide layer 214. For example, the carbon-based layers 262*a* and 262*b* may be deposited using organic precursor materials that react with metals (and thus the contact plug 240*a* and the dummy contact plug 240*b*) but not with dielectric materials (and thus not the oxide layer 214).

In some implementations, the carbon-based layer 262*a* (and similarly the carbon-based layer 262*b*) may have a thickness in a range from approximately 1 nm to approximately 5 nm. By selecting a thickness of at least 1 nm, the carbon-based layer 262*a* prevents barrier layer 606 (as described with respect to FIG. 7E) from forming on the contact plug 240*a*. Preventing the barrier layer 606 from depositing on the contact plug 240*a* reduces contact resistance at the contact plug 240*a*. By selecting a depth of no more than 5 nm, an amount of time, power, and chemicals used to etch the carbon-based layer 262*a* (as described with respect to FIG. 7F) is reduced.

Although described herein with respect to forming the carbon-based layer 262*a* on the contact plug 240*a* (and carbon-based layer 262*b* on the dummy contact plug 240*b*), the description similarly applies to forming a carbon-based layer 260 on the contact plug 238.

As further shown in FIG. 7B, ESL 216 may be formed over the oxide layer 214. The deposition tool 102 may deposit the ESL 216 by a CVD technique, a PVD technique, an ALD technique, or another type of deposition technique. The planarization tool 110 may planarize the ESL 216 after the ESL 216 is deposited.

In some implementations, the ESL 216 may have a thickness in a range from approximately 1 nm to approximately 3 nm. By selecting a thickness of at least 1 nm, the ESL 216 can function to prevent over-etching of layers above the ESL 216. Selecting a thickness of no more than 3 nm can prevent epitaxial growth of the ESL 216 over the carbon-based layer 262*a*, which prevents the ESL 216 from increasing contact resistance at the contact plug 240*a*.

Although described as a single ESL layer with a thickness in a range from approximately 1 nm to approximately 3 nm, the ESL 216 may include one or more additional layers. For example, the ESL 216 may include an additional silicon-based layer with a thickness in a range from approximately 1 nm to approximately 5 nm and/or an additional aluminum-based layer with a thickness in a range from approximately 1 nm to approximately 3 nm.

Figure 7C:
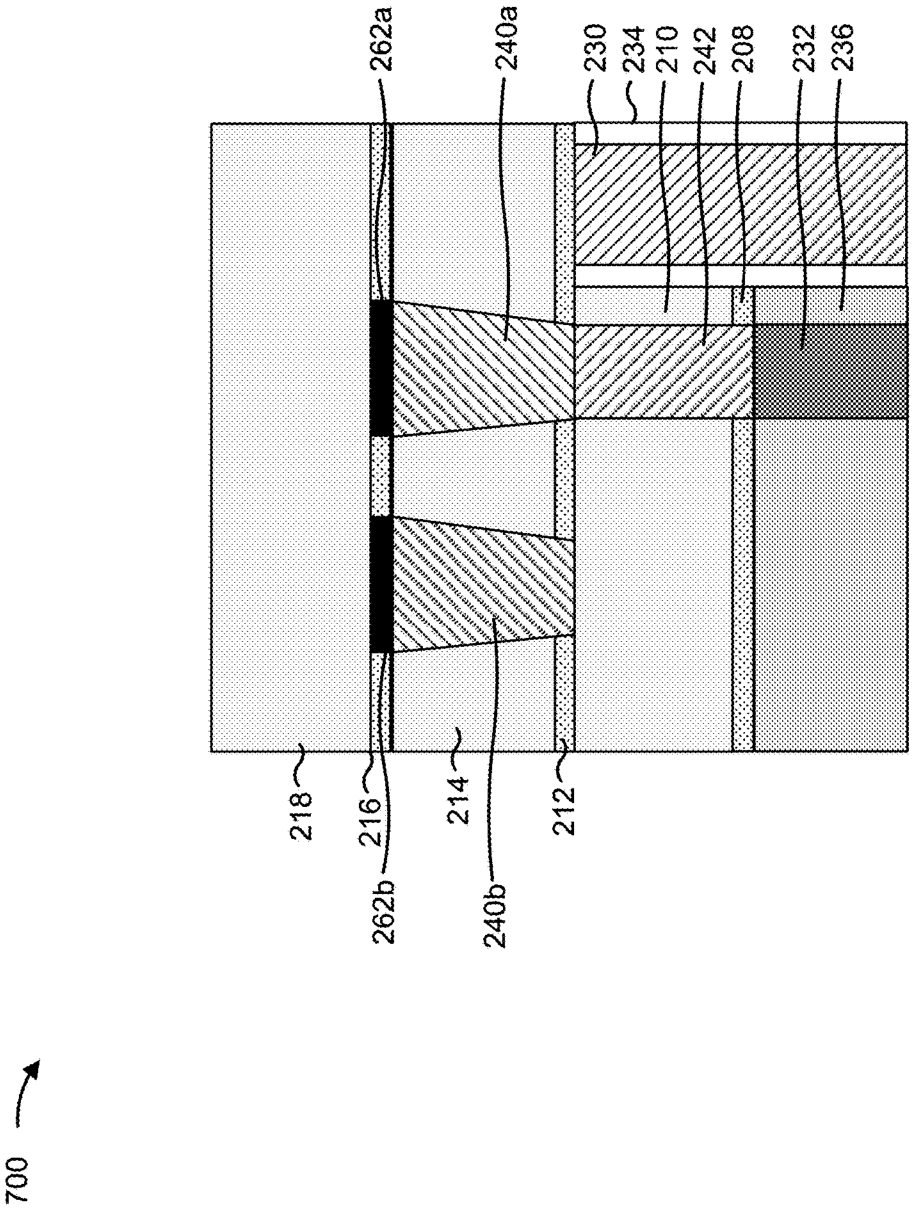

As shown in FIG. 7C, oxide layer 218 (also referred to as dielectric layer 218) may be formed over the ESL 216. The deposition tool 102 may deposit the oxide layer 218 by a CVD technique, a PVD technique, an ALD technique, or another type of deposition technique. The planarization tool 110 may planarize the oxide layer 218 after the oxide layer 218 is deposited.

Figure 7D:
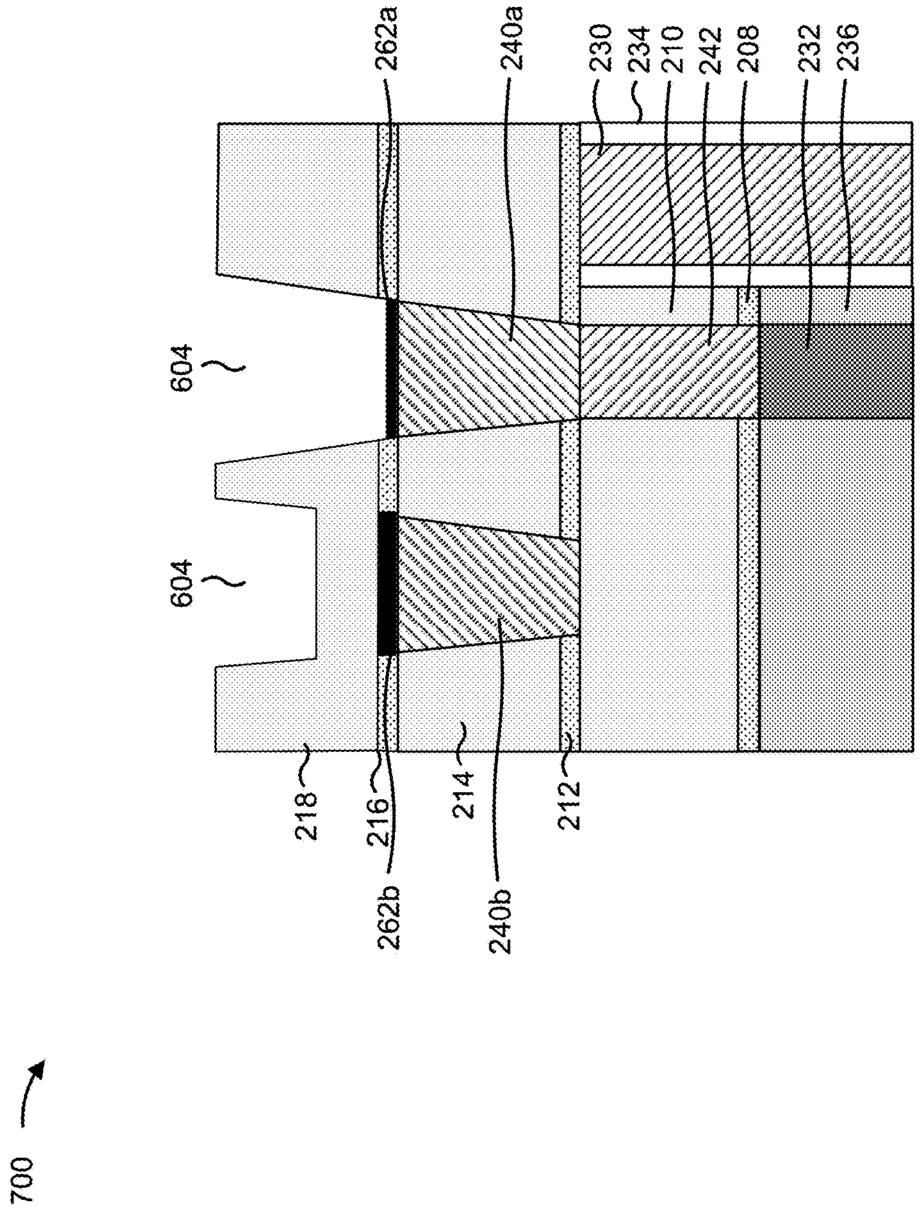

As shown in FIG. 7D, the oxide layer 218 may be etched to form openings (resulting in recesses 604). The recesses 604 may be etched such that the carbon-based layer 262*a* is at least partially exposed but the carbon based layer 262*b* is not. For example, the deposition tool 102 may form a photoresist layer on the oxide layer 218 (or on an ESL formed on the oxide layer 218, such as ESL 220), the exposure tool 104 may expose the photoresist layer to a radiation source to pattern the photoresist layer, the developer tool 106 may develop and remove portions of the photoresist layer to expose the pattern, and the etch tool 108 may etch portions of the oxide layer 218 to form the recesses 604. In some implementations, the photoresist removal tool 114 removes the remaining portions of the photoresist layer (e.g., using a chemical stripper, a plasma asher, and/or another technique) after the etch tool 108 etches the recesses 604.

Although described herein with respect to forming the recesses 604 in the oxide layer 218 above the contact plug 240*a* (and the dummy contact plug 240*b*), the description similarly applies to forming the recesses 604 in the oxide layer 218 above the contact plug 238.

Figure 7E:
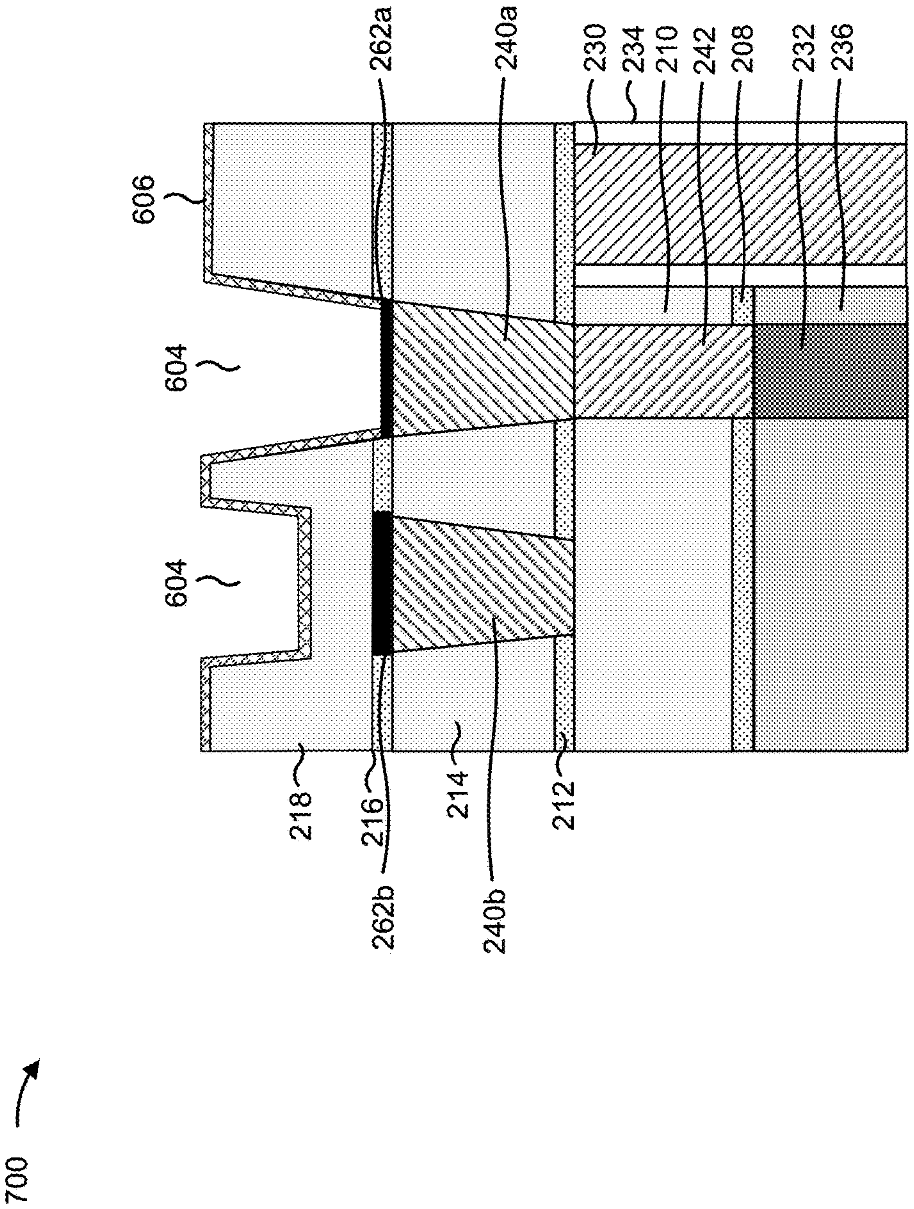

As shown in FIG. 7E, a barrier layer 606 may be formed on sidewalls of the recesses 604 (and, in some implementations, over at least a portion of the oxide layer 218). The deposition tool 102 may deposit the barrier layer 606 by a CVD technique, a PVD technique, an ALD technique, or another type of deposition technique. In some implementations, the barrier layer 606 is selectively deposited on the sidewalls of the recesses 604 but not on the carbon-based layer 262*a*. For example, the barrier layer 606 may be deposited using precursor materials that react with dielectrics (and thus the oxide layer 218) but not with organic materials (and thus not the carbon-based layer 262*a*). By preventing formation of the barrier layer 606 on the contact plug 240*a*, the carbon-based layer 262*a* reduces contact resistance at the contact plug 240*a*. The planarization tool 110 may planarize at least a portion of the barrier layer 606 after the barrier layer 606 is deposited.

Figure 7F:
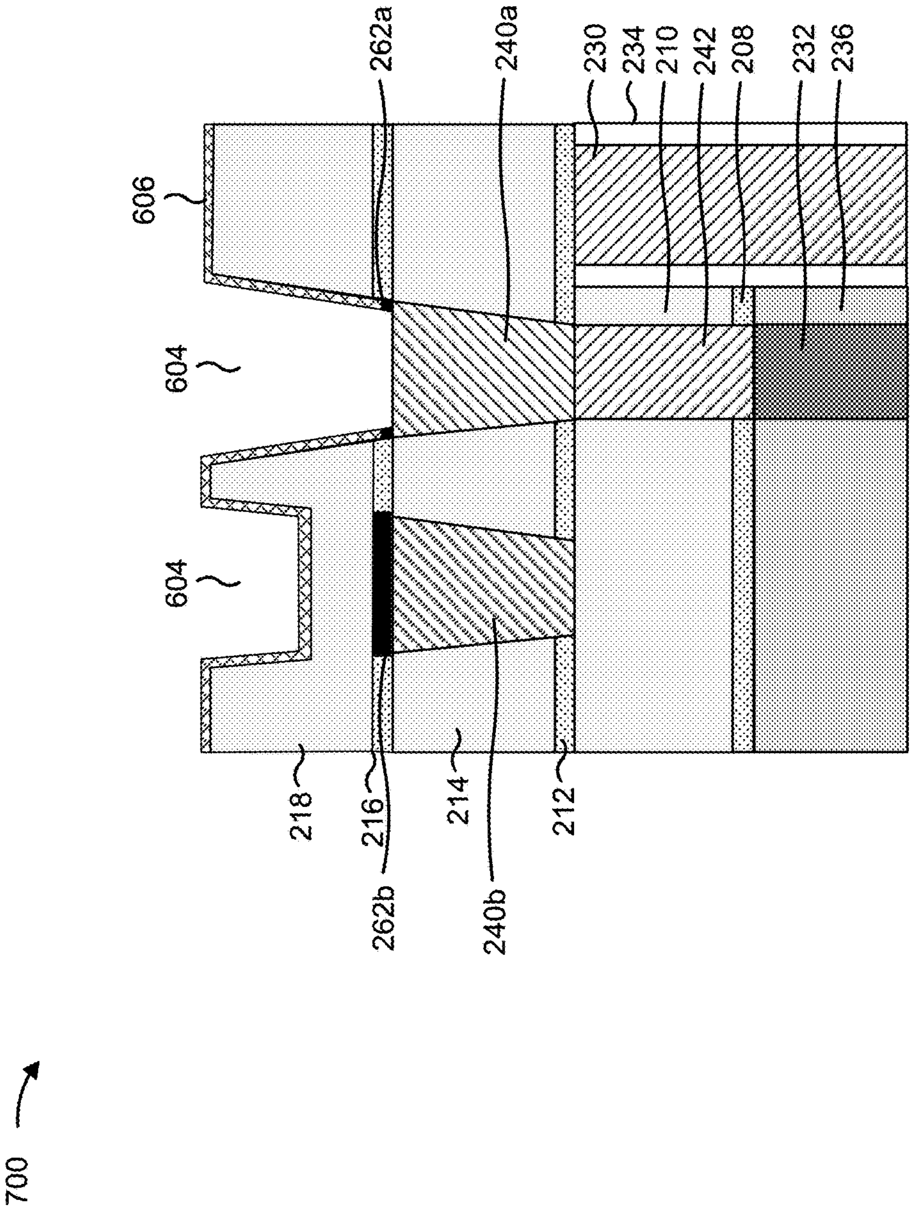

As shown in FIG. 7F, the carbon-based layer 262*a* may be etched. For example, the etch tool 108 may use one or more etching agents that react with organic materials (and thus the carbon-based layer 262*a*) and not with inorganic materials (and thus not the barrier layer 606 and the contact plug 240*a*). As further shown in FIG. 7G, a portion of the carbon-based layer 262*a* may remain between the barrier layer 606 and the contact plug 240*a*.

Figure 7G:
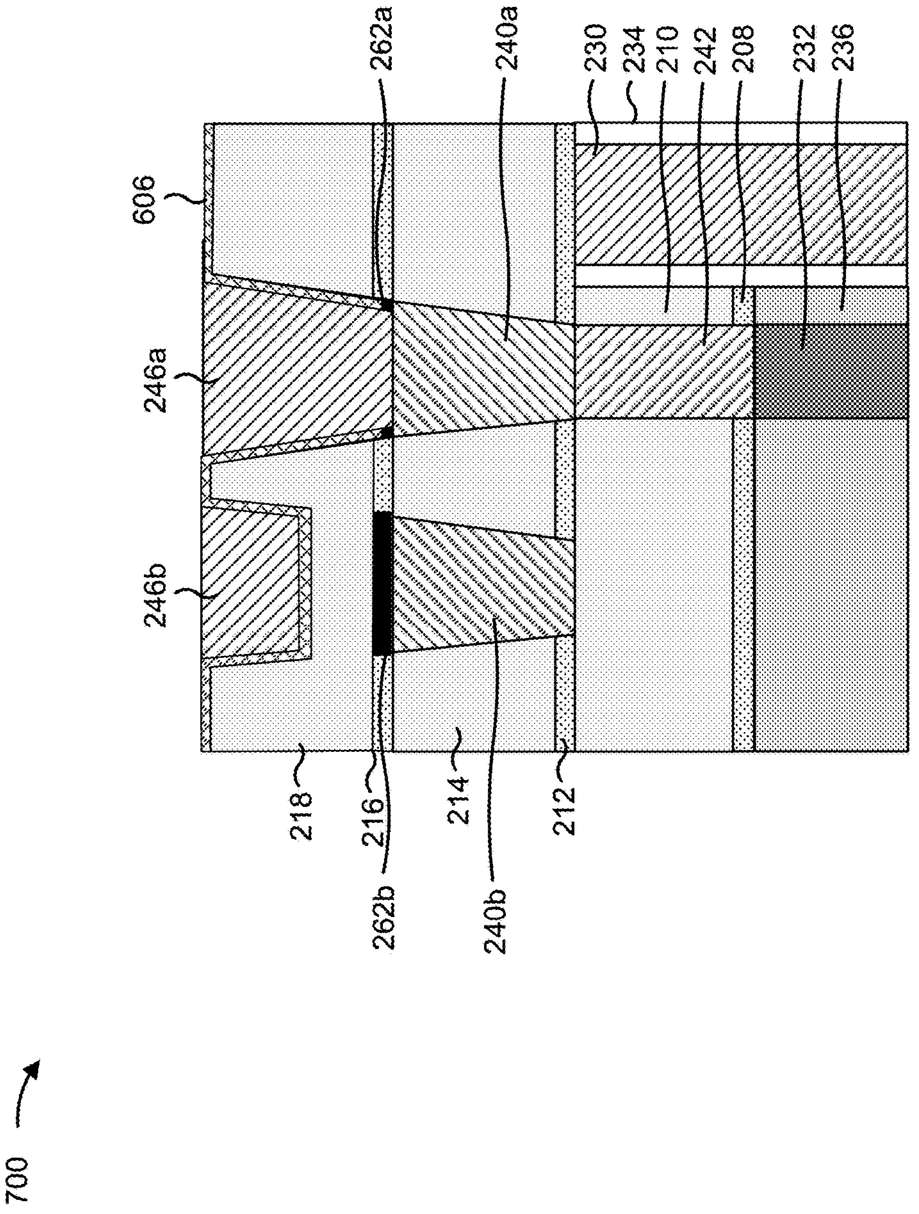

As shown in FIG. 7G, a metallization layer 246*a* and a dummy metallization layer 246*b* may be formed in the recesses 604. The metallization layer 246*a* may be formed over the contact 240*a* and electrically connect with the contact plug 240*a* while the dummy metallization layer 246*b* is formed over the dummy contact plug 240*b* but is electrically insulated from the dummy contact plug 240*b*. The deposition tool 102 may deposit the material of the metallization layer 246*a* and the dummy metallization layer 246*b* using a CVD technique, a PVD technique, an ALD technique, or another type of deposition technique, the plating tool 112 may deposit the material of the metallization layer 246*a* and the dummy metallization layer 246*b* using an electroplating operation, or a combination thereof. The planarization tool 110 may planarize the metallization layer 246*a* and the dummy metallization layer 246*b* after deposition. Because the carbon-based layer 262*a* was etched, contact resistance at a metal interface between the metallization layer 246*a* and the contact plug 240*a* is further reduced.

Although described herein with respect to forming the metallization layer 246*a* over the contact plug 240*a* (and the dummy metallization layer 246*b* over but not contacting the dummy contact plug 240*b*), the description similarly applies to forming a metallization layer 244 over the contact plug 238.

By using techniques as described in connection with FIGS. 7A-7G, the barrier layer 606 prevents diffusion of metal (e.g., copper) from the metallization layer 246*a*, which reduces resistivity of the metallization layer 246*a* and prevents failure of an electrical device including the metallization layer 246*a*. Additionally, the carbon-based layer 262*a* prevents deposition of the barrier layer 606 at the metal interface between the metallization layer 246*a* and the contact plug 240*a*, which reduces contact resistance at the metal interface. The carbon-based layer 262*a* is also etched before deposition of the metallization layer 246*a* to further reduce contact resistance at the metal interface.

As indicated above, FIGS. 7A-7G are provided as one or more examples. Other examples may differ from what is described with regard to FIGS. 7A-7G. For example, in some implementations, similarly as described with respect to FIGS. 4A-4G and FIGS. 5A-5H, the carbon-based layer 262*a* may be formed after deposition of the ESL 216 and the oxide layer 218 such that carbon (e.g., in the form of graphene or graphite) is not deposited on dummy contact plug 240*b*.

Figure 8:
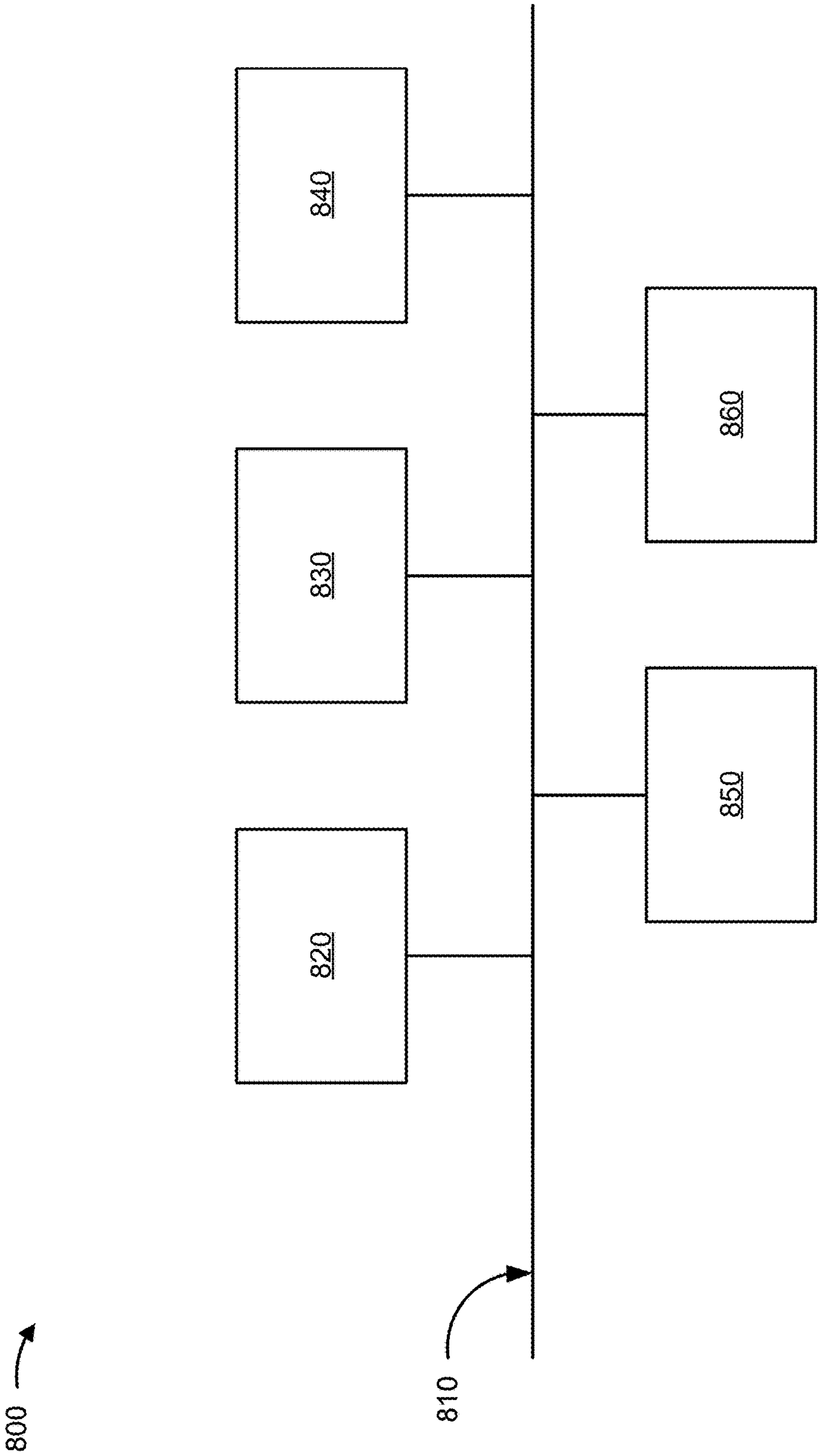
FIG. 8 is a diagram of example components of one or more devices of FIG. 1 described herein.

FIG. 8 is a diagram of example components of a device 800. In some implementations, one or more of the semiconductor processing tools 102-114 and/or the wafer/die transport tool 116 may include one or more devices 800 and/or one or more components of device 800. As shown in FIG. 8, device 800 may include a bus 810, a processor 820, a memory 830, an input component 840, an output component 850, and a communication component 860.

Bus 810 includes one or more components that enable wired and/or wireless communication among the components of device 800. Bus 810 may couple together two or more components of FIG. 8, such as via operative coupling, communicative coupling, electronic coupling, and/or electric coupling. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform one or more operations or processes described elsewhere herein.

Memory 830 includes volatile and/or nonvolatile memory. For example, memory 830 may include random access memory (RAM), read only memory (ROM), a hard disk drive, and/or another type of memory (e.g., a flash memory, a magnetic memory, and/or an optical memory). Memory 830 may include internal memory (e.g., RAM, ROM, or a hard disk drive) and/or removable memory (e.g., removable via a universal serial bus connection). Memory 830 may be a non-transitory computer-readable medium. Memory 830 stores information, instructions, and/or software (e.g., one or more software applications) related to the operation of device 800. In some implementations, memory 830 includes one or more memories that are coupled to one or more processors (e.g., processor 820), such as via bus 810.

Input component 840 enables device 800 to receive input, such as user input and/or sensed input. For example, input component 840 may include a touch screen, a keyboard, a keypad, a mouse, a button, a microphone, a switch, a sensor, a global positioning system sensor, an accelerometer, a gyroscope, and/or an actuator. Output component 850 enables device 800 to provide output, such as via a display, a speaker, and/or a light-emitting diode. Communication component 860 enables device 800 to communicate with other devices via a wired connection and/or a wireless connection. For example, communication component 860 may include a receiver, a transmitter, a transceiver, a modem, a network interface card, and/or an antenna.

Device 800 may perform one or more operations or processes described herein. For example, a non-transitory computer-readable medium (e.g., memory 830) may store a set of instructions (e.g., one or more instructions or code) for execution by processor 820. Processor 820 may execute the set of instructions to perform one or more operations or processes described herein. In some implementations, execution of the set of instructions, by one or more processors 820, causes the one or more processors 820 and/or the device 800 to perform one or more operations or processes described herein. In some implementations, hardwired circuitry may be used instead of or in combination with the instructions to perform one or more operations or processes described herein. Additionally, or alternatively, processor 820 may be configured to perform one or more operations or processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

Figure 9:
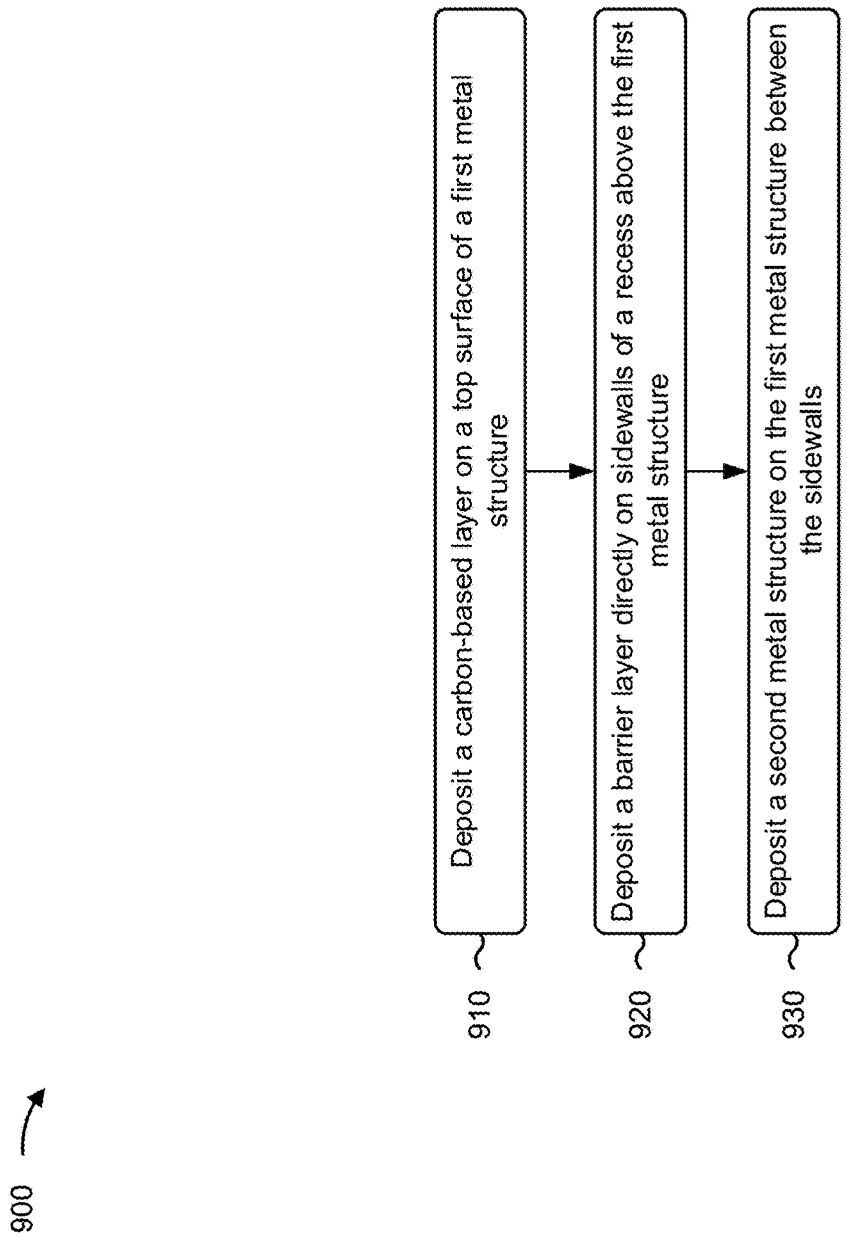
FIG. 9 is a flowchart of an example process relating to forming a semiconductor structure described herein.

FIG. 9 is a flowchart of an example process 900 associated with forming a graphene or graphite liner to reduce contact resistance. In some implementations, one or more process blocks of FIG. 9 may be performed by one or more semiconductor processing tools (e.g., one or more of the semiconductor processing tools 102-114). Additionally, or alternatively, one or more process blocks of FIG. 9 may be performed by one or more components of device 800, such as processor 820, memory 830, input component 840, output component 850, and/or communication component 860.

As shown in FIG. 9, process 900 may include depositing a carbon-based layer on a top surface of a first metal structure (block 910). For example, the one or more semiconductor processing tools 102-114 may deposit a carbon-based layer 256/262*a* on a top surface of a first metal structure 242/240*a*, as described herein.

As further shown in FIG. 9, process 900 may include depositing a barrier layer directly on sidewalls of a recess above the first metal structure (block 920). For example, the one or more semiconductor processing tools 102-114 may deposit a barrier layer 406/606 directly on sidewalls of a recess 404/604 above the first metal structure 242/240*a*, as described herein.

As further shown in FIG. 9, process 900 may include depositing a second metal structure on the first metal structure, within the recess, and between the sidewalls (block 930). For example, the one or more semiconductor processing tools 102-114 may deposit a second metal structure 240/246*a* on the first metal structure 242/240*a*, within the recess 404/604, and between the sidewalls, as described herein.

Process 900 may include additional implementations, such as any single implementation or any combination of implementations described below and/or in connection with one or more other processes described elsewhere herein.

In a first implementation, process 900 includes depositing an additional carbon-based layer 262*b* on a top surface of a first dummy metal structure 240*b*, and depositing a second dummy metal structure 246*b* above the first dummy metal structure, such that the second dummy metal structure 246*b* does not contact the first dummy metal structure 240*b*.

In a second implementation, alone or in combination with the first implementation, process 900 includes depositing at least one etch stop layer 216 and an oxide layer 218 after depositing the carbon-based layer 256/262*a*, and etching the oxide layer 218 to form the recess 404/604 above the first metal structure 242/240*a*.

In a third implementation, alone or in combination with the first implementation, process 900 includes depositing at least one etch stop layer 216 and an oxide layer 218 before depositing the carbon-based layer 256/262*a*, and etching the oxide layer 218 to form the recess 404/604 above the first metal structure 242/240*a*.

In a fourth implementation, alone or in combination with one or more of the first through third implementations, depositing the second metal structure 240/246*a* includes depositing the second metal structure 240/246*a* to interface with the first metal structure 242/240*a* at a metal interface, where the carbon-based layer 256/262*a* is at the metal interface.

In a fifth implementation, alone or in combination with one or more of the first through third implementations, process 900 includes etching a portion of the carbon-based layer 256/262*a* before depositing the second metal structure 240/246*a*, where a remaining portion of the carbon-based layer 256/262*a* is at an interface between the barrier layer 406/606 and the first metal structure 242/240*a*.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

In this way, a layer of carbon (e.g., graphite or graphene) at a metal interface (e.g., between an MEOL interconnect and a gate contact or a source or drain region contact, between an MEOL contact plug and a BEOL metallization layer, and/or between BEOL conductive structures) reduces contact resistance at the metal interface, which increases electrical performance of the electronic device. Additionally, in some implementations, the layer of carbon may help prevent heat transfer from a second metal to a first metal when the second metal is deposited over the first metal. This results in more symmetric deposition of the second metal, which reduces surface roughness and contact resistance at the metal interface. As an alternative, in some implementations, the layer of carbon is etched before deposition of the second metal in order to reduce contact resistance at the metal interface.

As described in greater detail above, some implementations described herein provide a semiconductor structure. The semiconductor structure includes a first metal structure adjacent to a first dummy metal structure within a first oxide layer. The semiconductor structure further includes a second oxide layer deposited above the first oxide layer. The semiconductor structure includes a second metal structure deposited on the first metal structure and within the second oxide layer. The semiconductor structure further includes a carbon-based layer deposited on a top surface of the first dummy metal structure.

As described in greater detail above, some implementations described herein provide a method. The method includes depositing a carbon-based layer on a top surface of a first metal structure. The method further includes depositing a barrier layer directly on sidewalls of a recess above the first metal structure. The method includes depositing a second metal structure on the first metal structure, within the recess, and between the sidewalls.

As described in greater detail above, some implementations described herein provide a semiconductor structure. The semiconductor structure includes a first metal structure. The semiconductor structure further includes a second metal structure deposited on the first metal structure and interfacing with the first metal structure at a metal interface. The semiconductor structure includes a carbon-based layer at the metal interface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a first oxide layer;

a first metal structure in the first oxide layer, wherein the first metal structure is a gate interconnect in contact with a gate contact, and the gate contact is in contact with a gate that is associated with a first source or drain, wherein the gate contact fully covers a top surface of the gate in a first dimension, and wherein the gate contact and the gate have substantially a same length in the first dimension;

a first dummy metal structure in the first oxide layer, wherein a bottom surface of the first dummy metal structure is in contact with only a second oxide layer below the first oxide layer;

a first carbon-based layer directly on a top surface of the first metal structure;

a second carbon-based layer directly on a top surface of the first dummy metal structure, wherein a thickness of the second carbon-based layer is greater than a thickness of the first carbon-based layer;

a third oxide layer over the first oxide layer, the first metal structure, the first dummy metal structure, the first carbon-based layer, and the second carbon-based layer;

a first barrier layer in a first recess in the third oxide layer;

a second barrier layer in a second recess in the third oxide layer;

a second metal structure in the first recess and directly on the first carbon-based layer; and a second dummy metal structure in the second recess, wherein the second dummy metal structure is directly on a bottom of the second barrier layer and above the second carbon-based layer, wherein the second carbon-based layer is separated from the second dummy metal structure and the bottom of the second barrier layer by the third oxide layer, and wherein, in a side view of the semiconductor structure, the second dummy metal structure is aligned with, and resides directly above, the second carbon-based layer.

2. The semiconductor structure of claim 1, further comprising:

an etch stop layer between the first oxide layer and the second oxide layer, wherein the first carbon-based layer and the second carbon-based layer reside within the etch stop layer.

3. The semiconductor structure of claim 2, wherein the first barrier layer is in contact with the second metal structure, the second oxide layer, and the etch stop layer.

4. The semiconductor structure of claim 2, wherein a top surface of the etch stop layer resides above a top surface of the first carbon-based layer.

5. The semiconductor structure of claim 1, wherein the second barrier layer is on sidewalls of the second recess and is in contact with the second dummy metal structure.

6. The semiconductor structure of claim 1, further comprising:

a third metal structure in the third oxide layer, wherein the third metal structure is a source contact or a drain contact and is coupled with a second source or drain.

7. The semiconductor structure of claim 1, wherein each of the first carbon-based layer and the second carbon-based layer has a depth of at least 1 nanometer (nm).

8. The semiconductor structure of claim 1, wherein the second metal structure comprises a metallization layer.

9. The semiconductor structure of claim 1, wherein the gate contact is within the second oxide layer.

10. The semiconductor structure of claim 9, wherein the gate contact extends entirely through the second oxide layer.

11. The semiconductor structure of claim 1, wherein a bottom surface of the first carbon-based layer resides on a same plane as a bottom surface of the second carbon-based layer, and wherein a top surface of the first carbon-based layer resides below a top surface of the second carbon-based layer.

12. A semiconductor structure, comprising:

a first metal structure in a first oxide layer, wherein the first metal structure is a gate interconnect in contact with a gate contact, and the gate contact is in contact with a gate associated with a first source or drain, wherein the gate contact fully covers a top surface of the gate in a first dimension, and wherein the gate contact and the gate have substantially a same length in the first dimension;

a first dummy metal structure in the first oxide layer, wherein a bottom surface of the first dummy metal structure is in contact with only a second oxide layer below the first oxide layer;

a first carbon-based layer directly on a top surface of the first metal structure;

a second carbon-based layer directly on a top surface of the first dummy metal structure, wherein a thickness of the second carbon-based layer is greater than a thickness of the first carbon-based layer;

a third oxide layer above the first oxide layer, the first metal structure, the first dummy metal structure, the first carbon-based layer, and the second carbon-based layer;

a second metal structure above the first metal structure and in the third oxide layer, wherein the second metal structure has a first barrier layer on sidewalls of the second metal structure and the first barrier layer is absent from a bottom surface of the second metal structure; and a second dummy metal structure in the third oxide layer, wherein the second carbon-based layer is separated from the second dummy metal structure by the third oxide layer, and wherein, in a side view of the semiconductor structure, the second dummy metal structure is aligned with and resides directly above the second carbon-based layer.

13. The semiconductor structure of claim 12, wherein the first carbon-based layer substantially prevents contact between the first metal structure and the second metal structure.

14. The semiconductor structure of claim 12, further comprising:

a second barrier layer between the first metal structure and the first oxide layer.

15. The semiconductor structure of claim 12, further comprising:

an etch stop layer having a thickness within a range from approximately 1 nanometer (nm) to approximately 3 nm, wherein the first carbon-based layer and the second carbon-based layer reside in the etch stop layer.

16. The semiconductor structure of claim 12, wherein each of the first carbon-based layer and the second carbon-based layer has a depth that is within a range from approximately 1 nanometer (nm) to approximately 5 nm.

17. A semiconductor structure, comprising:

a first oxide layer;

a first metal structure and a first dummy metal structure in the first oxide layer, wherein the first metal structure is a gate interconnect in contact with a gate contact, and the gate contact is coupled with a gate that is associated with a first source or drain, wherein the gate contact fully covers a top surface of the gate in a first dimension, and wherein the gate contact and the gate have substantially a same length in the first dimension;

an etch stop layer over the first oxide layer;

a first carbon-based layer directly on a top surface of the first metal structure and within a first portion of the etch stop layer;

a second carbon-based layer above the first dummy metal structure and within a second portion of the etch stop layer, wherein a thickness of the second carbon-based layer is greater than a thickness of the first carbon-based layer;

a first barrier layer on sidewalls of a recess above the first carbon-based layer;

a second oxide layer over the etch stop layer;

a second metal structure in the second oxide layer, wherein the second metal structure has the first barrier layer on sidewalls of the second metal structure and the first barrier layer is absent from a bottom surface of the second metal structure, and wherein the bottom surface of the second metal structure is in contact with the first carbon-based layer; and a second dummy metal structure in a second recess of the second oxide layer, wherein, in a side view of the semiconductor structure, the second dummy metal structure is aligned with, and resides directly above, the second carbon-based layer.

18. The semiconductor structure of claim 17, wherein the first carbon-based layer and the second carbon-based layer reside within the etch stop layer.

19. The semiconductor structure of claim 17, further comprising:

a second barrier layer in the second recess in the second oxide layer, wherein the second carbon-based layer is separated from the second dummy metal structure and a bottom surface of the second barrier layer by the second oxide layer.

20. The semiconductor structure of claim 17, wherein the second metal structure comprises a metallization layer.

* * * * *